US012690448B2

(12) United States Patent　　　　(10) Patent No.: US 12,690,448 B2
Lim et al.　　　　　　　　　　　　　(45) Date of Patent: Jul. 21, 2026

(54) INTEGRATED CIRCUIT DEVICE AND ELECTRONIC DEVICE INCLUDING THE SAME

(71) Applicant: Samsung Electronics Co., Ltd., Suwon-si (KR)

(72) Inventors: Dokyung Lim, Suwon-si (KR); Wooseok Kim, Suwon-si (KR); Wonsik Yu, Suwon-si (KR); Chanyoung Jeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 728 days.

(21) Appl. No.: 17/980,728

(22) Filed: Nov. 4, 2022

(65) Prior Publication Data

US 2023/0145187 A1　　May 11, 2023

(30) Foreign Application Priority Data

Nov. 11, 2021　(KR) ........................ 10-2021-0155150

(51) Int. Cl.
　*H10W 20/41*　　　(2026.01)
　*H10D 84/90*　　　(2025.01)
　　　　(Continued)
(52) U.S. Cl.
　CPC ......... *H10W 20/435* (2026.01); *H10W 20/42* (2026.01); *H10W 20/427* (2026.01);
　　　　(Continued)
(58) Field of Classification Search
　CPC ........................ H01L 23/5226; H01L 23/5283
　See application file for complete search history.

(56) References Cited

U.S. PATENT DOCUMENTS

| | | | |
|---|---|---|---|
| 6,404,226 B1 | 6/2002 | Schadt | |
| 6,696,828 B2 | 2/2004 | Yoshizawa | |
| | (Continued) | | |

FOREIGN PATENT DOCUMENTS

| | | |
|---|---|---|
| EP | 1865555 A1 | 12/2007 |
| JP | 2007-081338 A | 3/2007 |
| | (Continued) | |

OTHER PUBLICATIONS

Extended European Search Report dated Mar. 9, 2023 issued in corresponding European Appln. No. 22206555.9.

(Continued)

*Primary Examiner* — Amar Movva
(74) *Attorney, Agent, or Firm* — Fish & Richardson P.C.

(57) ABSTRACT

An integrated circuit device includes a substrate, and a unit cell on the substrate. The unit cell defines a unit cell area including at least two discrete devices. The unit cell includes a routing layer configured to route a signal and a voltage to the at least two discrete devices, the routing layer including a signal line and a voltage line extending in a first direction, and the signal line and the voltage line spaced apart from each other in a second direction, and a metal line stack including metal lines stacked between the unit cell area and the routing layer in the first direction. A plurality of contact vias are each configured to connect at least two adjacent ones of the signal line, the voltage line, the metal lines and the at least two discrete devices, in a third direction.

20 Claims, 19 Drawing Sheets

(51) Int. Cl.
  H10W 20/42          (2026.01)
  H10W 20/43          (2026.01)

(52) U.S. Cl.
  CPC .......... H10W 20/43 (2026.01); H10D 84/975
            (2025.01); H10D 84/981 (2025.01)

(56)                    References Cited

U.S. PATENT DOCUMENTS

| | | |
|---|---|---|
| 7,394,156 B2 | 7/2008 | Tokunaga et al. |
| 8,513,707 B2 | 8/2013 | Herberholz |
| 9,184,256 B2 | 11/2015 | Huang et al. |
| 2008/0169487 A1 | 7/2008 | Shimbo et al. |
| 2009/0321791 A1* | 12/2009 | Wagner .................. H10D 89/10 257/E27.07 |
| 2011/0210383 A1 | 9/2011 | Inoue et al. |
| 2019/0221514 A1 | 7/2019 | Kim |
| 2019/0258775 A1 | 8/2019 | Kim et al. |
| 2019/0295940 A1 | 9/2019 | Liaw |
| 2020/0058656 A1 | 2/2020 | Guo et al. |

FOREIGN PATENT DOCUMENTS

| | | |
|---|---|---|
| KR | 10-2019-0087844 A | 7/2019 |
| WO | WO 2008023437 A1 | 2/2008 |

OTHER PUBLICATIONS

Office Action in Korean Appln. No. 10-2022-0058845, mailed on Nov. 16, 2025, 16 pages (with machine translation).
Office Action in Taiwanese Appln. No. 111142413, mailed on Dec. 26, 2025, 23 pages (with machine translation).
Notice of Allowance in Korean Appln. No. 10-2022-0058845, mailed on Apr. 11, 2026, 6 pages (with machine translation).

* cited by examiner

1000

INTEGRATED CIRCUIT DEVICE AND ELECTRONIC DEVICE INCLUDING THE SAME

CROSS-REFERENCE TO RELATED APPLICATIONS

This application claims priority under 35 U.S.C. § 119 to Korean Patent Application No. 10-2022-0058845 filed on May 13, 2022, and to Korean Patent Application No. 10-2021-0155150 filed on Nov. 11, 2021, in the Korean Intellectual Property Office, the disclosures of each of which are incorporated by reference herein in their entireties.

FIELD

Some example embodiments of the present inventive concepts described herein relate to an integrated circuit device, an electronic device including the integrated circuit device, an integrated circuit device capable of a high-speed operation, and/or an electronic device including the integrated circuit device.

BACKGROUND

An operating speed desired or required for an integrated circuit device is being rapidly increased. In this case, a voltage drop depending on a high-speed operation may occur due to the influence of a parasitic component of the integrated circuit device. Alternatively, the performance of the integrated circuit device may be deteriorated due to an increase in current density depending on the high-speed operation. Furthermore, in this case, an error may occur in an operation of an electronic device including the integrated circuit device.

SUMMARY

Some example embodiments of the present inventive concepts provide an integrated circuit device capable of stably operating even in a high-speed operation and an electronic device including the integrated circuit device.

According to an example embodiment, an integrated circuit device includes a substrate, and a unit cell on the substrate, wherein the unit cell defines a unit cell area including at least two discrete devices. The unit cell includes a routing layer configured to route a signal and a voltage to the at least two discrete devices, the routing layer including a signal line and a voltage line extending in a first direction, and the signal line and the voltage line spaced apart from each other in a second direction, a metal line stack including metal lines stacked between the unit cell area and the routing layer in the first direction, and a plurality of contact vias each configured to connect at least two adjacent ones of the signal line, the voltage line, the metal lines and the at least two discrete devices, in a third direction.

The routing layer may include at least two layers.

At least one of the signal line and the voltage line may include two or more lines, and signal or voltage lines located adjacent to each other among the signal lines and the voltage lines may be evenly spaced apart from each other by a first separation distance.

The same number of contact VIAs may be formed for each of the discrete devices, the signal line, the voltage line, and the metal lines.

The metal line stack may be separately formed for the signal line and the voltage line.

In the unit cell, the routing of the signal and the voltage for the at least two discrete devices may be performed in the third direction.

Among the metal lines, a metal line located adjacent to the unit cell area may have a higher resistance value than a metal line located adjacent to the routing layer, and the signal line and the voltage line may have a lower resistance value than a metal line located adjacent thereto among the metal lines.

m*n unit cells (m and n being integers of 1 or larger) may form a unit cell array, the m unit cells may be provided in the first direction to form n rows of the unit cell array, and the unit cells located adjacent to each other in the first direction may be electrically isolated by a device isolation film.

The signal line, the voltage line, and the metal lines located adjacent to each other in the first direction may be respectively connected, and the unit cells located adjacent to each other in the first direction may be routed by the connected signal line and the connected voltage line.

The integrated circuit device may further include an array signal line that connects the signal lines of the n rows and an array voltage line that connects the voltage lines of the n rows.

Rows located adjacent to each other in the second direction among the n rows may be spaced apart from each other by a second separation distance.

The signal line and the voltage line may be disposed in the same sequence in the second direction for each of the n rows.

When driving strength of the unit cell is 1, driving strength of the unit cell array may be m*n.

p*q unit cells (p and q being integers of 1 or larger) may further form a second unit cell array, and the first unit cell array and the second unit cell array may be electrically connected.

The signal line may include an input signal line and an output signal line that route an input signal and an output signal for the at least two discrete devices. The voltage line may include a power voltage line and a ground voltage line that apply a power voltage and a ground voltage to the at least two discrete devices. The at least two discrete devices may include an NMOS transistor and a PMOS transistor in which the input signal is applied to a gate, the output signal is output from a source-drain region, and the power voltage or the ground voltage is applied to the source-drain region.

Each of the NMOS transistor and the PMOS transistor may be a planar field effect transistor (planar FET), a fin FET, a gate all around FET (GAAFET), or a multi-bridge channel FET (MBCFET), but example embodiments are not limited thereto.

According to an example embodiment, an integrated circuit device includes a unit inverter, wherein the unit inverter includes an NMOS transistor and a PMOS transistor in a unit cell area of a substrate, an input signal line, an output signal line, a power voltage line, and a ground voltage line extending in a first direction and configured to route an input signal, an output signal, a power voltage, and a ground voltage to the NMOS transistor and the PMOS transistor, and a metal line stack including metal lines extending in the first direction and stacked one above another, wherein the metal lines include at least one separate metal line corresponding to each of the input signal line, the output signal line, the power voltage line, and the ground voltage line, and wherein the metal lines connect the NMOS transistor and the PMOS transistor with corresponding ones of the input signal line, the output signal line, the power voltage line, and the ground voltage line through contact vias.

Signal or voltage lines located adjacent to each other among the input signal line, the output signal line, the power voltage line, and the ground voltage line may be spaced apart from each other by a first separation distance in a second direction.

When a metal line located adjacent to the NMOS transistor or the PMOS transistor in a third direction among the metal lines of the metal line stack is referred to as a first metal line and a metal line located adjacent to the input signal line, the output signal line, the power voltage line, or the ground voltage line in the third direction is referred to a k-th metal line (k being an integer of 2 or larger), at least two contact VIAs may be formed between the NMOS transistor or the PMOS transistor and the first metal line, between metal lines located adjacent to each other in the third direction among the metal lines of the metal line stack, and between the k-th metal line and the input signal line, the output signal line, the power voltage line, or the ground voltage line.

When a metal line located adjacent to the NMOS transistor or the PMOS transistor in a third direction among the metal lines of the metal line stack is referred to as a first metal line and a metal line located adjacent to the input signal line, the output signal line, the power voltage line, or the ground voltage line in the third direction is referred to a k-th metal line (k being an integer of 2 or larger), the k-th metal line may have a lower resistance value than the first metal line, and the input signal line, the output signal line, the power voltage line, or the ground voltage line may have a lower resistance value than the k-th metal line.

m*n unit inverters may form a unit inverter array, the m unit inverters may be provided in the first direction to form n rows of the unit inverter array, and the unit inverters located adjacent to each other in the first direction may be electrically isolated by a device isolation film.

The input signal line, the output signal line, the power voltage line, and the ground voltage line may be connected in the first direction. The integrated circuit device may further include an array input line that connects the input signal lines of the n rows, an array output line that connects the output signal lines of the n rows, an array power line that connects the power voltage lines of the n rows, and an array ground line that connects the ground voltage lines of the n rows.

Rows located adjacent to each other in the second direction among the n rows may be spaced apart from each other by a second separation distance.

The input signal line, the output signal line, the power voltage line, and the ground voltage line may be disposed in the same sequence in the second direction for each of the n rows.

When driving strength of the unit inverter is 1, driving strength of the unit inverter array may be m*n.

The integrated circuit device may further include a ring oscillator in which an odd number of driving inverters greater than or equal to three, each of which includes one or more the unit inverter arrays, are provided between a first end and a second end. An output of a driving inverter located adjacent to the first end among driving inverters located adjacent to each other in the first direction may be applied as an input of a driving inverter located adjacent to the second end, and an output of a driving inverter located closest to the second end may be fed back to a driving inverter located closest to the first end.

The integrated circuit device may further include a clock driver in which at least two driving inverters, each of which includes one or more the unit inverter arrays, are provided between a first end and a second end, and an output of a driving inverter located adjacent to the first end among driving inverters located adjacent to each other in the first direction may be applied as an input of a driving inverter located adjacent to the second end.

According to an example embodiment, an electronic device includes the integrated circuit device and a function block that operates in response to a clock or signal generated or controlled by the integrated circuit device.

BRIEF DESCRIPTION OF THE FIGURES

The above and other objects and features of the present inventive concepts will become apparent by describing in detail some example embodiments thereof with reference to the accompanying drawings.

DETAILED DESCRIPTION

Hereinafter, some embodiments of the present inventive concepts will be described clearly and in detail e.

Figure 1:
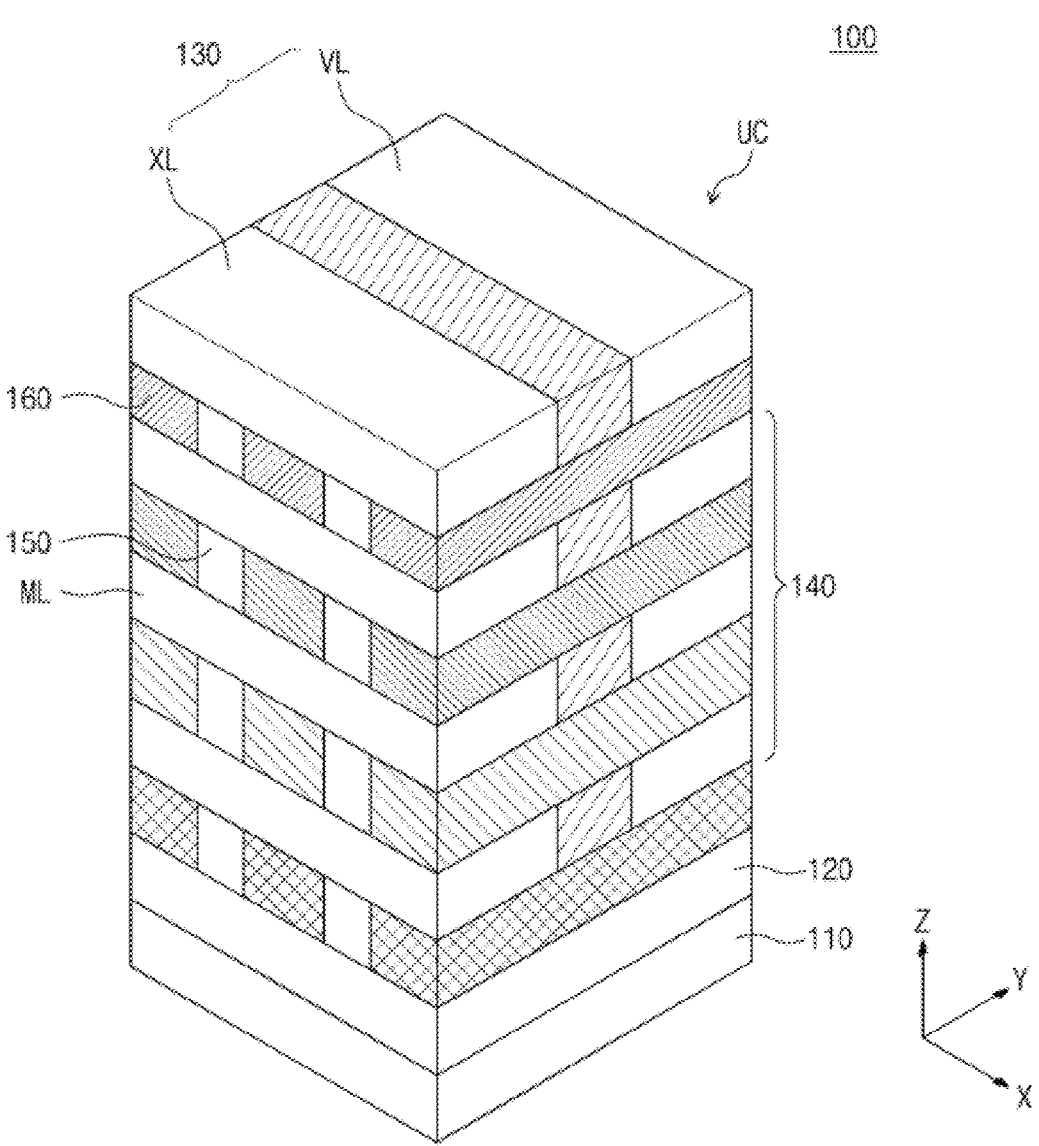
FIG. 1 is a view illustrating an integrated circuit device including a unit cell according to an example embodiment of the present inventive concepts.

FIG. 1 is a view illustrating an integrated circuit device including a unit cell according to an example embodiment of the present inventive concepts.

Referring to FIG. 1, the integrated circuit device 100 according to an example embodiment of the present disclosure may include a substrate 110 and at least one unit cell UC formed on the substrate 110.

The substrate 110 may contain one or more semiconductor materials, such as silicon (Si), germanium (Ge), silicon germanium (SiGe), gallium arsenide (GaAs), or silicon germanium carbon (SiGeC), but example embodiments are not limited thereto. The substrate 110 may be a bulk silicon substrate or a semiconductor on insulator (SOI) substrate.

The unit cell UC may refer to a circuit in which at least two discrete devices DD1 and DD2 are electrically connected to perform a unit operation. The unit operation may refer to, for example, logical product, logical sum, logical complement, logical inversion, storage, or delay of unit inputs or unit data. The discrete devices DD1 and DD2 may refer to, for example, transistors, diodes, light-emitting diodes (LEDs), photodiodes, inductors, resistors, or capacitors, but example embodiments are not limited thereto.

The unit cell UC may include a unit cell area 120, a routing layer 130, a metal line stack 140, and a plurality of contact VIAs 150.

The unit cell area 120 may be formed on a partial area of the substrate 110. The unit cell area 120 may be isolated from another area of the substrate 110 adjacent thereto in a first direction (e.g., the x-axis direction) or a second direction (e.g., the y-axis direction) by a device isolation film (not illustrated). The device isolation film may contain an insulating material such as silicon oxide.

The at least two discrete devices DD1 and DD2 may be formed in the unit cell area 120. As described above, the discrete devices DD1 and DD2 may be transistors.

The routing layer 130 may perform routing on a signal and a voltage for the discrete devices DD1 and DD2. The routing layer 130 may include a signal line XL routing the signal for the discrete devices DD1 and DD2 and a voltage line VL routing the voltage for the discrete devices DD1 and DD2. The signal line XL and the voltage line VL may be connected with external control logic (not illustrated) or a power source (not illustrated) and may transmit and receive the signal or the voltage.

The signal line XL and the voltage line VL may be formed in the x-axis direction and may be spaced apart from each other in the y-axis direction.

The metal line stack 140 may be formed between the unit cell area 120 and the routing layer 130. For example, the metal line stack 140 may be formed between the discrete devices DD1 and DD2 of the unit cell area 120 and the signal line XL and the voltage line VL of the routing layer 130.

The metal line stack 140 may be separately provided for the signal line XL and the voltage line VL. For example, two metal line stacks 140 may be provided for one signal line XL and one voltage line VL. In some example embodiments, the two metal line stacks 140 may also be spaced apart from each other in the y-axis direction when the signal line XL and the voltage line VL are spaced apart from each other in the y-axis direction.

The metal line stack 140 may be formed by stacking metal lines ML in multiple layers. The metal lines ML may be formed of aluminum (Al), tungsten (W), titanium (Ti), or copper (Cu), but example embodiments are not limited thereto. An insulating layer 160 may be formed between the metal lines ML. Likewise to the signal line XL or the voltage line VL, the metal lines ML may be formed in the x-axis direction.

The metal lines ML constituting the metal line stack 140 may have higher resistance values when located adjacent to the unit cell area 120 in a third direction (e.g., the z-axis direction) than when located adjacent to the routing layer 130 in the third direction. The resistance values may refer to resistance values for unit areas and unit lengths of metal lines ML. Hereinafter, it is the same. Furthermore, the resistance values of the metal lines ML constituting the metal line stack 140 may be decreased as the separation distances from the unit cell area 120 in the z-axis direction are increased.

Likewise to the metal lines ML, the signal line XL and the voltage line VL may be formed of a metal component. The signal line XL and the voltage line VL may have a lower resistance value than a metal line ML located adjacent thereto among the metal lines ML constituting the metal line stack 140.

The plurality of contact VIAs 150 may connect corresponding devices or lines among the discrete devices DD1 and DD2, the signal line XL or the voltage line VL, and the plurality of metal lines ML. The plurality of contact VIAs 150 may connect the discrete devices DD1 and DD2 and the metal line ML located adjacent thereto in the z-axis direction, may connect the metal lines ML located adjacent to each other in the z-axis direction, may connect the metal line ML and the signal line XL located adjacent to each other in the z-axis direction, or may connect the metal line ML and the voltage line VL located adjacent to each other in the z-axis direction. The plurality of contact VIAs 150 may be provided by forming holes in the insulating layer 160, which is formed between the discrete devices DD1 and DD2 and the metal line ML adjacent to each other in the z-axis direction, between the metal lines ML adjacent to each other in the z-axis direction, between the metal line ML and the signal line XL adjacent to each other in the z-axis direction, or between the metal line ML and the voltage line VL adjacent to each other in the z-axis direction, and thereafter filling the holes with a conductive material.

In the unit cell UC of the integrated circuit device 100 that has the above-described structure, routing may be performed between the signal line XL or the voltage line VL of the routing layer 130 and the discrete devices DD1 and DD2 only in one direction, that is, the z-axis direction. That is, a signal or voltage may be transferred only to devices or lines adjacent to each other in the z-axis direction through the contact VIAs 150, and thus the length of wiring desired or required for routing may be reduced or minimized. Furthermore, as routing is performed in the unit cell UC via the metal line stack 140 constituted by the plurality of metal lines ML, resistance components of the metal lines ML in the respective layers may be processed in parallel, and thus the influence of resistance on routing of a signal or voltage of the unit cell UC may be reduced or minimized.

Accordingly, the integrated circuit device 100 according to some example embodiments of the present inventive concepts may reduce or minimize the influence of resistance on routing in the unit cell UC. As a result, the integrated circuit device 100 according to some example embodiments of the present inventive concepts may reduce parasitic resistance against routing to inhibit or prevent a voltage drop caused by the parasitic resistance, thereby stably performing a high-speed operation.

The matters regarding the first, second, and third directions defined in FIG. 1, for example, the x-axis, y-axis, and z-axis directions may be identically applied to drawings to be described below.

Figure 2:
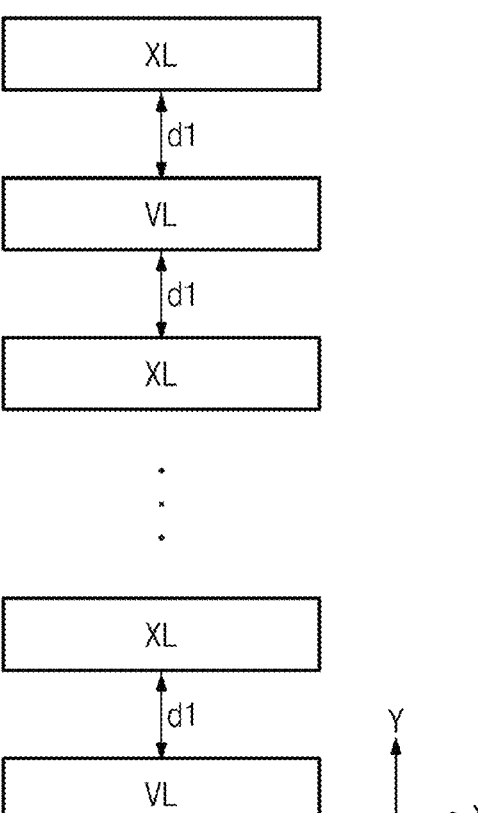
FIG. 2 is a view illustrating signal lines and voltage lines according to an example embodiment of the present inventive concepts.

FIG. 2 is a view illustrating signal lines and voltage lines according to an example embodiment of the present disclosure.

Referring to FIGS. 1 and 2, the numbers and types of signal lines XL and voltage lines VL of the routing layer 130 according to example embodiments of the present inventive concepts may correspond to the numbers and types of discrete devices DD1 and DD2. For example, as many signal lines XL as signals applied to or output from the discrete devices DD1 and DD2 may be provided. For example, as many voltage lines VL as the types of voltages applied to the discrete devices DD1 and DD2 may be provided.

When the plurality of signal lines XL or voltage lines VL are provided as described above, lines adjacent to each other among the signal lines XL and the voltage lines VL may be evenly spaced apart from each other by a first separation distance d1 in the y-axis direction. Although FIG. 2 illustrates one example that the signal lines XL and the voltage liens VL are alternately disposed, the present disclosure is not limited thereto.

Figure 3:
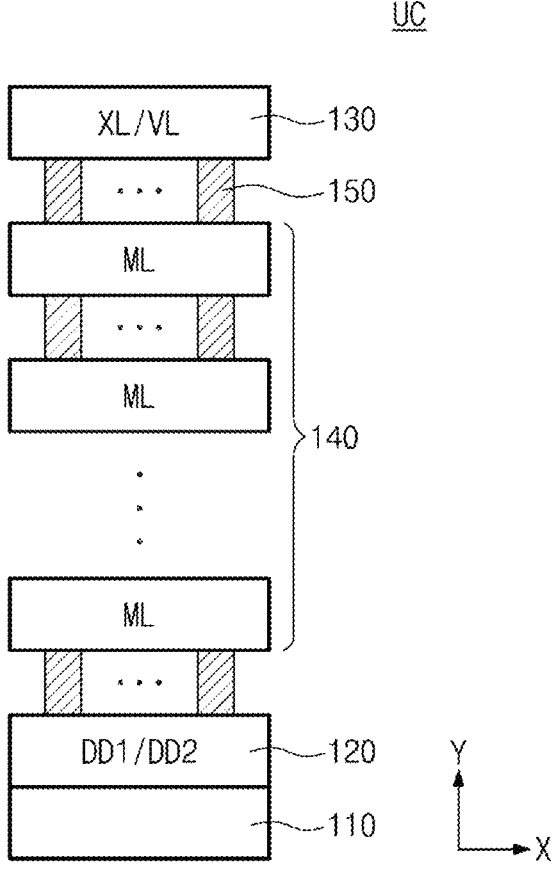
FIG. 3 is a view illustrating contact VIAs according to an example embodiment of the present inventive concepts.

FIG. 3 is a view illustrating contact VIAs according to an example embodiment of the present inventive concepts.

Referring to FIGS. 2 and 3, the contact VIAs 150 according to an example embodiment of the present inventive concepts may be provided between the layers of the unit cell UC, that is, between the discrete devices DD1 and DD2 and the metal line ML, between the metal lines ML of the metal line stack 140, and between the metal line ML and the signal line XL or the voltage line VL. Furthermore, the same or substantially the same number of contact VIAs 150 may be provided between the layers. However, without being limited thereto, the number of contact VIAs formed between some layers of the unit cell UC may differ from the number of contact VIAs formed between the other layers of the unit cell UC.

The number of contact VIAs 150 formed in the unit cell area 120 may be limited by a design rule applied in the design of the unit cell UC. In the unit cell UC according to an example embodiment of the present inventive concepts, the signal lines XL or the voltage lines VL may be evenly spaced apart from each other by the first separation distance d1, and thus an increased or maximum number of contact VIAs 150 may be provided while meeting the design rule. Accordingly, resistance components of the contact VIAs 150 may be processed in parallel, and thus the influence of resistance by routing in the unit cell UC may be reduced or minimized.

Figure 4:
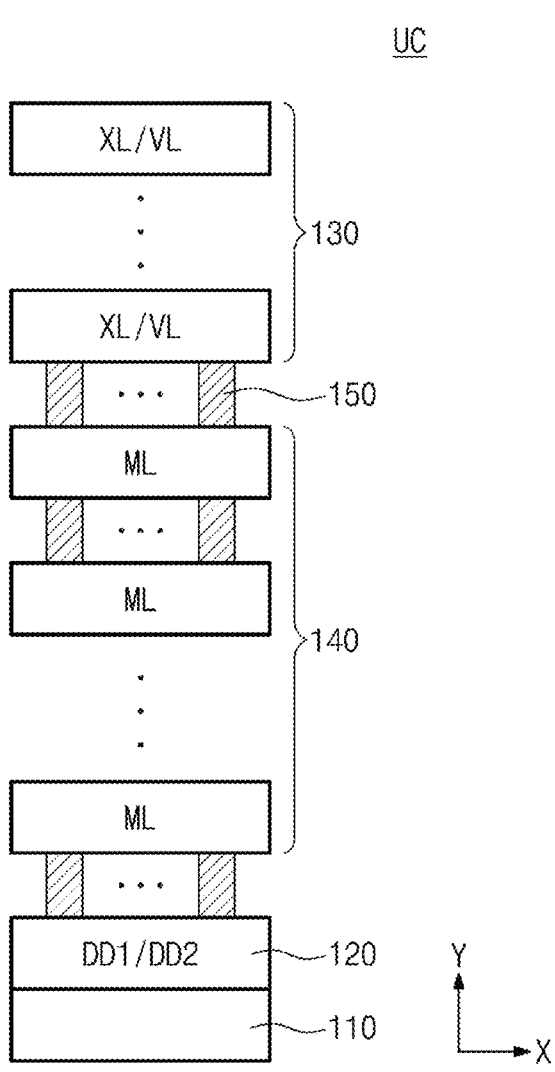
FIG. 4 is a view illustrating a routing layer according to an example embodiment of the present inventive concepts.

FIG. 4 is a view illustrating a routing layer according to an example embodiment of the present disclosure.

Referring to FIG. 4, the routing layer 130 according to an example embodiment of the present inventive concepts may include two or more layers. For example, the routing layer 130 may be provided in multiple layers depending on the magnitude of a signal or voltage required for the signal line XL or the voltage line VL, the width of wiring, the separation distance between lines, and the like. In each of the multiple routing layers 130, the signal line XL and the voltage line VL may be identically or differently provided.

Figure 5:
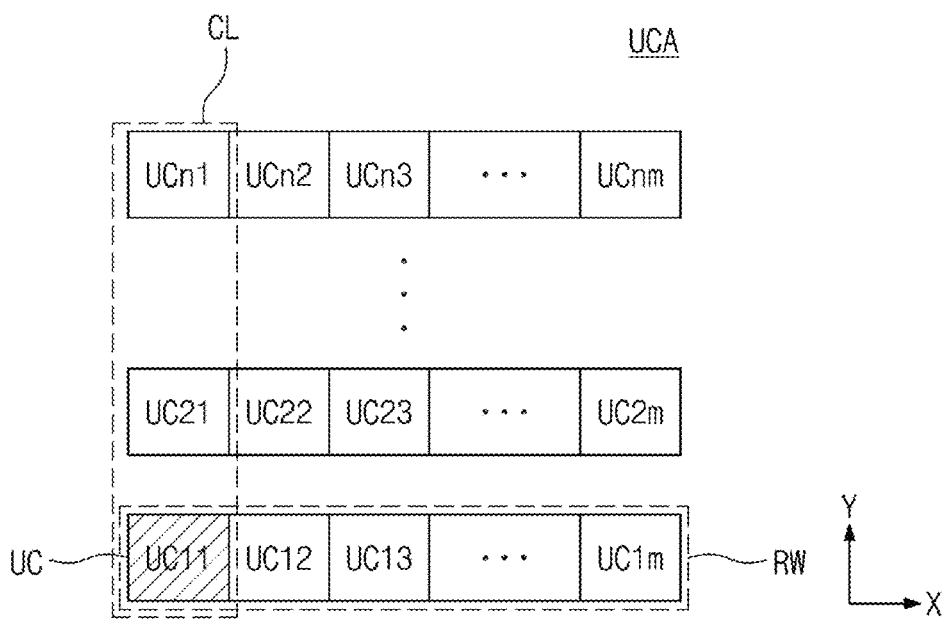
FIG. 5 is a view illustrating the integrated circuit device including a unit cell array according to an example embodiment of the present inventive concepts.

FIG. 5 is a view illustrating the integrated circuit device including a unit cell array according to an example embodiment of the present inventive concepts.

Referring to FIGS. 1 and 5, the integrated circuit device 100 according to an example embodiment of the present inventive concepts may include m*n unit cells UC in an array form. That is, the integrated circuit device 100 according to an example embodiment of the present inventive concepts may include a unit cell array UCA having m unit cells UC in the x-axis direction and n unit cells UC in the y-axis direction. m and n may be integers of 1 or larger. In the unit cell array UCA, the m unit cells UC in the x-axis direction may be referred to as one row RW, and the n unit cells UC in the y-axis direction may be referred to as one column CL.

In the unit cell array UCA, each of the m unit cells UC constituting the one row RW may be formed in contact with a unit cell UC located adjacent thereto in the x-axis direction on the substrate 110. That is, each of the m unit cells UC may be formed in contact with the unit cell area 120 of the unit cell UC located adjacent thereto in the x-axis direction on the substrate 110. The adjacent unit cell area 120 may be electrically isolated by a device isolation film (not illustrated).

As described above, a merged or shared area (e.g., a drain area between adjacent unit cells) does not exist between the unit cells UC located adjacent to each other in the x-axis direction. Accordingly, the integrated circuit device 100 according to some example embodiments of the present inventive concepts may prevent a current by the merged area from being concentrated on one side of the unit cells UC located adjacent to each other to cause a voltage drop.

The signal line XL, the voltage line VL, and the metal lines ML of FIG. 1 may be commonly provided for each of the unit cells UC constituting the row RW of the unit cell array UCA. That is, the signal line XL, the voltage line VL, and the metal lines ML of FIG. 1 may extend, or may be connected, in the x-axis direction and may be connected to each of the unit cells UC constituting the row RW of the unit cell array UCA.

Because routing is performed only in the z-axis direction within one unit cell UC as described above, routing between the unit cells UC located adjacent to each other in the x-axis direction may be performed only by the signal line XL and the voltage line VL. That is, the metal lines ML of the metal line stack 140 may not be involved in the routing between the unit cells UC located adjacent to each other in the x-axis direction.

As described above, in routing a signal or voltage between the unit cells UC located adjacent to each other in the x-axis direction, the integrated circuit device 100 according to some example embodiments of the present inventive concepts may perform the routing by the signal line XL and the voltage line VL of the routing layer 130 that have a relatively low resistance value, thereby reducing or minimizing the influence of resistance by the routing and stably performing a high-speed operation.

Figure 6:
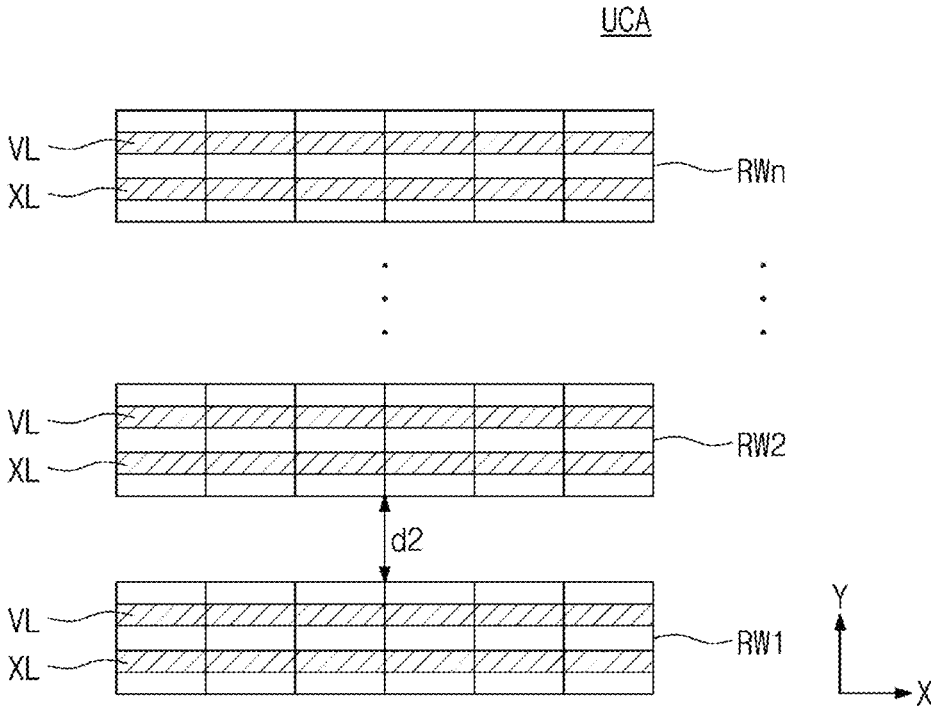
FIG. 6 is a view illustrating arrangement of a signal line and a voltage line in a unit cell array according to an example embodiment of the present inventive concepts.

FIG. 6 is a view illustrating arrangement of a signal line and a voltage line in a unit cell array according to an example embodiment of the present inventive concepts.

Referring to FIGS. 5 and 6, each of n rows RW1 to RWn of the unit cell array UCA may be formed to be spaced apart from a row RW adjacent thereto in the y-axis direction on the substrate 110 by a second separation distance d2 in the y-axis direction. For example, the first row RW1 and the second row RW2 may be formed to be spaced apart from each other by the second separation distance d2. That is, each of the n unit cells UC constituting the one column CL may be formed to be spaced apart from a unit cell UC located adjacent thereto in the y-axis direction on the substrate 110. The second separation distance d2 may correspond to the width of a power rail connected to the row RW.

In each of the n rows RW1 to RWn of the unit cell array UCA, the sequence of the signal line XL or the voltage line VL in the y-axis direction may be the same or substantially the same. For example, when the signal line XL and the voltage line VL are disposed in sequence in the y-axis direction for the first row RW1, the signal line XL and the voltage line VL may be disposed in sequence in the y-axis direction even in the second row RW2. Although not illustrated, the same applies to the case in which the plurality of signal line XL and the plurality of voltage line VL are provided as in FIG. 2.

As described above, the unit cell array UCA according to the embodiment of the present disclosure may prevent the problem in which when the distance between the rows RW is shorter than the second separation distance d2 or the rows RW are formed in contact with each other, the signal line XL or the voltage line VL is merged or shared to increase current density.

Figure 7:
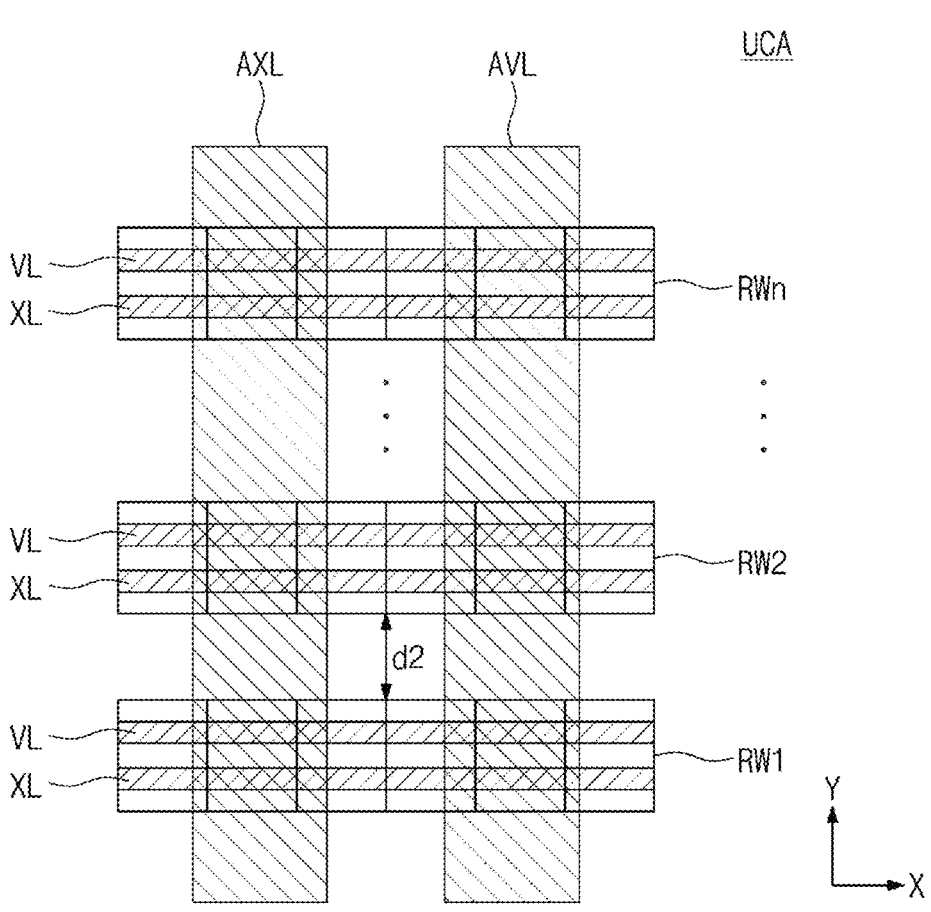
FIG. 7 is a view illustrating the integrated circuit device including an array signal line and an array voltage line according to an example embodiment of the present inventive concepts.

FIG. 7 is a view illustrating the integrated circuit device including an array signal line and an array voltage line according to an embodiment of the present disclosure.

Referring to FIGS. 1 and 7, the integrated circuit device 100 according to an example embodiment of the present inventive concepts may further include the array signal line AXL and the array voltage line VAL that connect the signal lines XL and the voltage lines VL of the rows RW1 to RWn of the unit cell array UCA. When the metal line stack 140 is formed under the routing layer 130 of each unit cell UC in the z-axis direction, the array signal line AXL and the array voltage line AVL may be formed over the routing layer 130 of each unit cell UC. Furthermore, the array signal line AXL and the array voltage line AVL may be formed in the y-axis direction.

The array signal line AXL may be connected with the signal lines XL of the rows RW1 to RWn of the unit cell array UCA. The array signal line AXL may receive a main input from the outside and may apply the main input to the discrete devices DD1 and DD2, or may receive a signal applied from the discrete devices DD1 and DD2 to the signal lines XL and may transfer the signal to the outside as a main output. The array voltage line AVL may be connected with the voltage lines VL of the rows RW1 to RWn of the unit cell array UCA and may apply a voltage from the outside to the discrete devices DD1 and DD2. Although not illustrated, when the plurality of signal lines XL and the plurality of voltage lines VL are provided as in FIG. 2, the same or substantially the same number of array signal lines AXL and array voltage lines AVL as the signal lines XL and the voltage lines VL may be provided.

Figure 8:
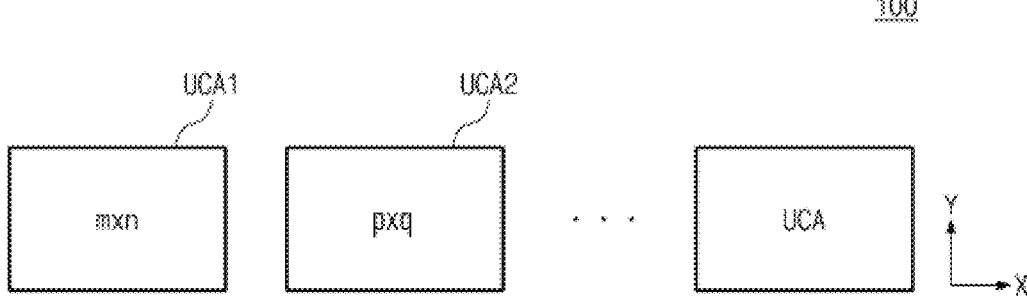
FIGS. 8 and 9 are views illustrating the integrated circuit device including a plurality of unit cell arrays according to an example embodiment of the present inventive concepts.
Figure 9:
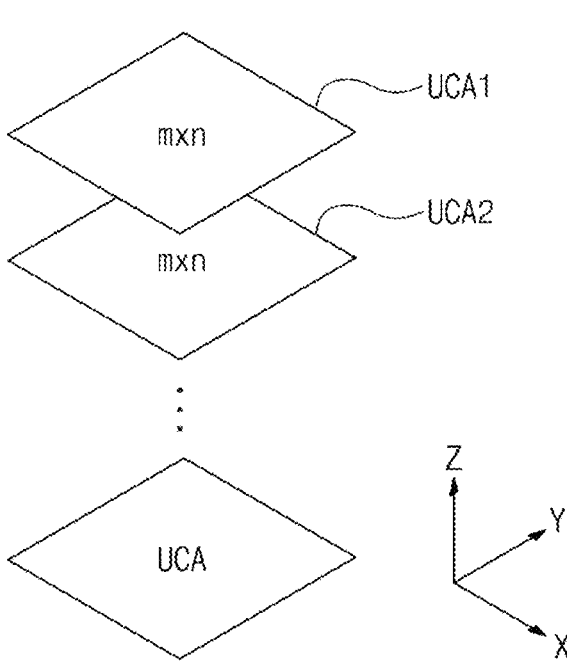

FIGS. 8 and 9 are views illustrating the integrated circuit device including a plurality of unit cell arrays according to an example embodiment of the present inventive concepts.

Referring to FIGS. 5 and 8, the integrated circuit device 100 according to an example embodiment of the present inventive concepts may include the plurality of unit cell arrays UCA. Each of the unit cell arrays UCA may include the same number of unit cells UC or a different number of unit cells UC. For example, a first unit cell array UCA1 may include m*n unit cells UC, and a second unit cell array UCA2 may include p*q unit cells UC. m*n may be equal to or different from p*q.

The number of unit cells UC included in each unit cell array UCA may correspond to driving strength required for the unit cell array UCA. For example, when the driving strength of the unit cell UC of the integrated circuit device 100 according to an example embodiment of the present inventive concepts is "1", the driving strength of the first unit cell array UCA1 including the m*n unit cells UC may be "m*n", and the driving strength of the second unit cell array UCA2 including the p*q unit cells UC may be "p*q". p and q may be integers of 1 or larger. The desired or maximum number of unit cells UC included in each unit cell array UCA may be set to correspond to power consumption of the unit cell array UCA or allowable power consumption for the entire integrated circuit device 100.

Furthermore, although not illustrated, the plurality of unit cell arrays UCA may be electrically connected. For example, a main output of the first unit cell array UCA1 may be input to the second unit cell array UCA2 as a main input of the second unit cell array UCA2.

The number of unit cells UC included in each of the unit cell arrays UCA and the connection relationship between the unit cell arrays UCA may correspond to an operation desired or required for the integrated circuit device 100. For example, the number of unit cells UC included in each of the unit cell arrays UCA and the connection relationship between the unit cell arrays UCA may be set to correspond to oscillation, buffering, and driving required for the integrated circuit device 100.

Referring to FIGS. 5 and 9, the integrated circuit device 100 according to an example embodiment of the present inventive concepts may include the plurality of unit cell arrays UCA stacked one above another. The number of unit cells UC included in the unit cell array UCA of each layer and the connection relationship between the unit cell arrays UCA of the respective layers are the same or substantially the same as those described with reference to FIG. 8.

Figure 10:
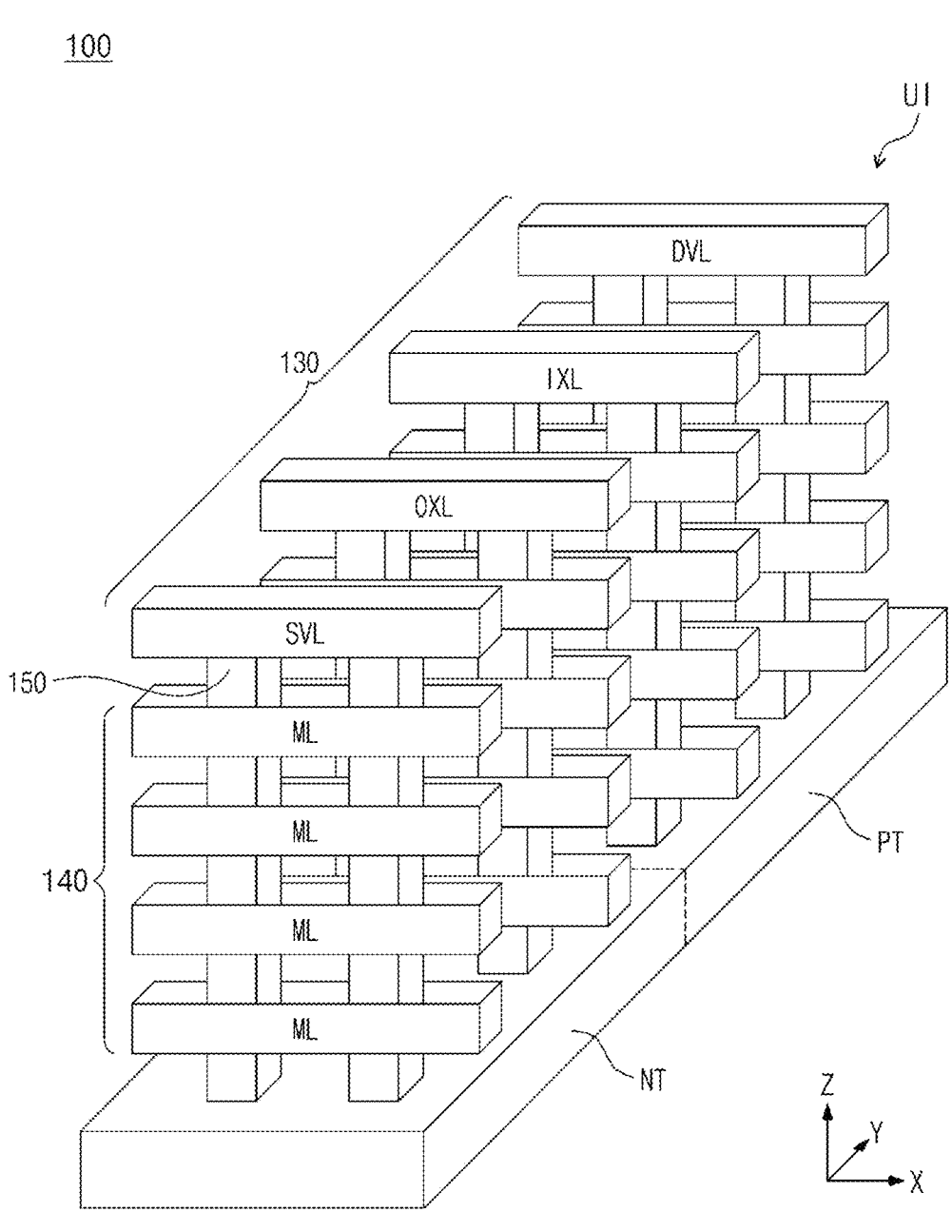
FIGS. 10, 11 and 12 are a perspective view, a plan view, and a side view of a unit inverter according to an example embodiment of the present inventive concepts.
Figure 11:
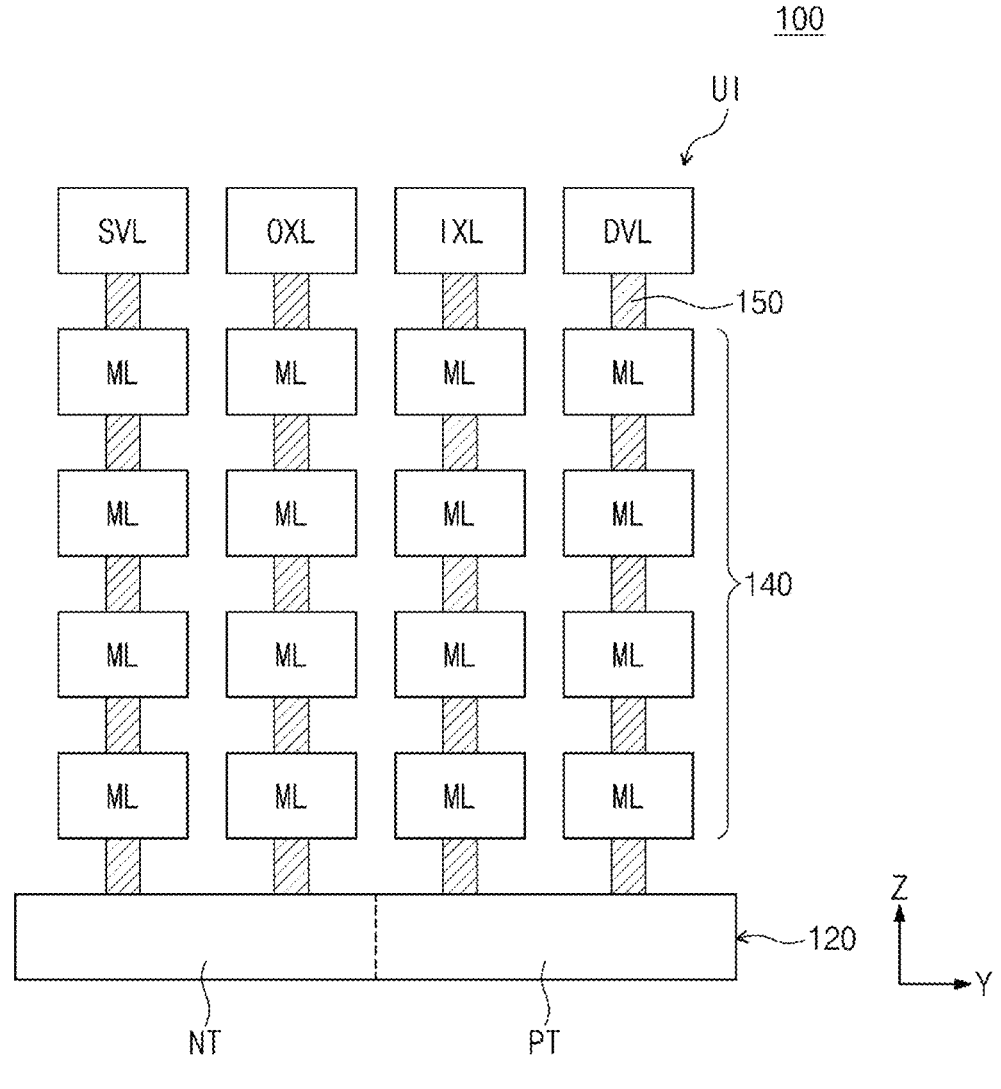
Figure 12:
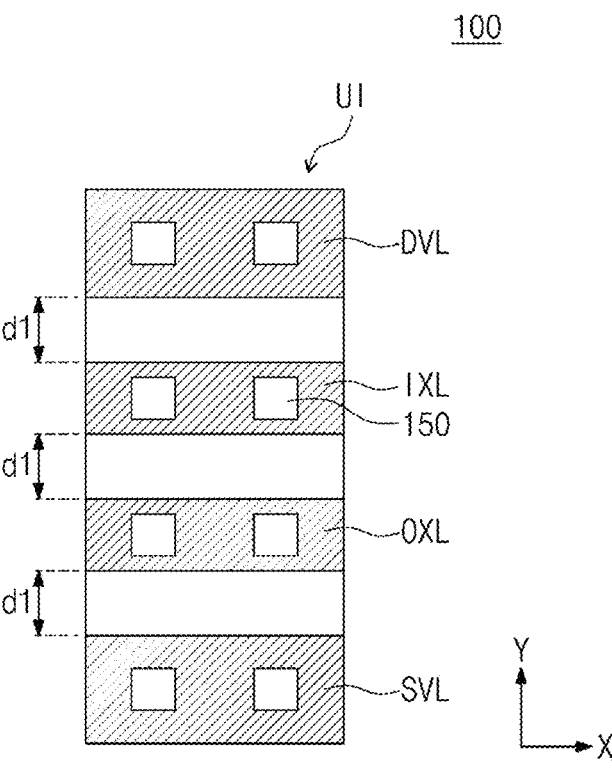

FIGS. 10 to 12 are a perspective view, a plan view, and a side view of a unit inverter according to an example embodiment of the present inventive concepts.

Referring to FIGS. 1 and 10 to 12, the unit inverter UI may be provided as a unit cell UC in the integrated circuit device 100 according to an example embodiment of the present inventive concepts. In some example embodiments, the discrete devices DD1 and DD2 may be a PMOS transistor PT and an NMOS transistor NT, the signal line XL may include an input signal line IXL and an output signal line OXL, and the voltage line VL may include a power voltage line DVL and a ground voltage line SVL.

Although FIGS. 10 to 12 illustrate one example that the ground voltage line SVL, the output signal line OXL, the input signal line IXL, and the power voltage line DVL are disposed in sequence in the y-axis direction, the present inventive concepts are not limited thereto, and the sequence may be changed. The ground voltage line SVL, the output signal line OXL, the input signal line IXL, and the power voltage line DVL may be evenly spaced apart from each other by the first separation distance d1 in the y-axis direction.

The metal line stack 140 may be separately formed for the input signal line IXL, the output signal line OXL, the power voltage line DVL, and the ground voltage line SVL. The metal lines ML of the metal line stack 140 and the input signal line IXL, the output signal line OXL, the power voltage line DVL, and the ground voltage line SVL of the routing layer 130 may all be formed in the x-axis direction.

In the metal line stack 140, the resistance value of the metal line adjacent to the unit cell area 120 in the z-axis direction, that is, the resistance value of the first metal line ML may be higher than the resistance value of the metal line ML adjacent to the routing layer 130, that is, the resistance value of the fourth metal line ML. The resistance value of the second metal line ML may be lower than or equal to the resistance value of the first metal line ML and may be higher than the resistance value of the third metal line ML. Likewise, the resistance value of the third metal line ML may be lower than or equal to the resistance value of the second metal line ML and may be higher than the resistance value of the fourth metal line ML. The resistance values of the input signal line IXL, the output signal line OXL, the power voltage line DVL, and the ground voltage line SVL may be lower than the resistance value of the fourth metal line ML. Although FIGS. 10 to 12 illustrate one example that the metal line stack 140 includes a total of four metal lines ML, the present inventive concepts are not limited thereto.

In the example that the metal line stack 140 includes a total of four metal lines ML, at least two contact VIAs 150 may be provided between the PMOS transistor PT or the NMOS transistor NT and the first metal line ML, between the first metal line ML and the second metal line ML, between the second metal line ML and the third metal line ML, between the third metal line ML and the fourth metal line ML, and between the fourth metal line ML and the input signal line IXL, the output signal line OXL, the power voltage line DVL, or the ground voltage line SVL.

For example, because the ground voltage line SVL, the output signal line OXL, the input signal line IXL, and the power voltage line DVL are evenly spaced apart from each other by the first separation distance d1 in the y-axis direction as described above, a desired or maximum of two contact VIAs 150 may be formed between the layers of the unit inverter UI (that is, between the PMOS transistor PT or the NMOS transistor NT and the first metal line ML, between the first metal line ML and the second metal line ML, between the second metal line ML and the third metal line ML, between the third metal line ML and the fourth metal line ML, and between the fourth metal line ML and the input signal line IXL, the output signal line OXL, the power voltage line DVL, or the ground voltage line SVL) under the condition that meets the design rule for the unit inverter UI.

However, the present inventive concepts are not limited thereto. Depending on a change in the design rule or a change in the material of the transistor or the metal line, three or more contact VIAs 150 may be provided between the layers of the unit inverter UI. Alternatively, the number of contact VIAs 150 formed between one or more layers may differ from the number of contact VIAs 150 formed between other layers.

As described above, in the integrated circuit device 100 according to some example embodiments of the present inventive concepts, the unit inverter UI has the above-described structure, and thus routing of a signal or voltage in the unit inverter UI may be performed in one direction (e.g., the z-axis direction). Accordingly, the influence of resistance on the routing may be reduced or minimized. Furthermore, in the integrated circuit device 100 according to some example embodiments of the present inventive concepts, the unit inverter UI includes a desired or maximum number of contact VIAs, and thus the influence of resistance on the routing may be reduced or minimized.

Figure 13:
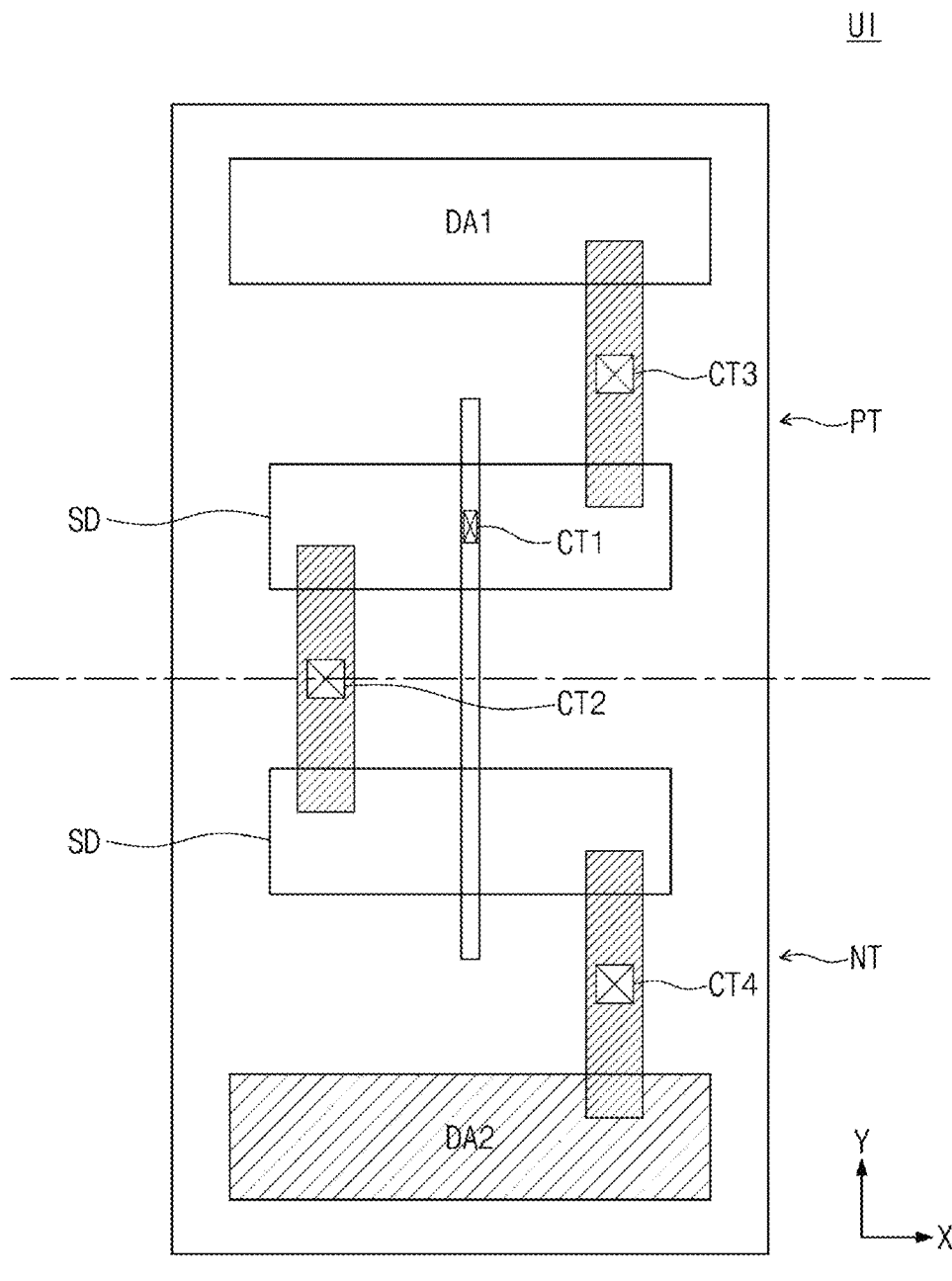
FIG. 13 is a view illustrating a structure of a unit inverter according to an example embodiment of the present inventive concepts.

FIG. 13 is a view illustrating a structure of a unit inverter according to an example embodiment of the present inventive concepts.

Referring to FIGS. 10 and 13, the unit inverter UI according to an example embodiment of the present inventive concepts may include, in the unit cell area 120, the NMOS transistor NT and the PMOS transistor PT located adjacent to each other in the y-axis direction.

The input signal line IXL may be electrically connected with a contact CT1 of a gate GT common to the NMOS transistor NT and the PMOS transistor PT. The output signal line OXL may be electrically connected with a contact CT2 that connects source-drain areas SD of the NMOS transistor NT and the PMOS transistor PT. The power voltage line DVL may be electrically connected with a contact CT3 that connects the source-drain area SD of the PMOS transistor PT and a first doping area DA1. The ground voltage line SVL may be electrically connected with a contact CT4 that connects the source-drain area SD of the NMOS transistor NT and a second doping area DA2. The first doping area DA1 and the second doping area DA2 may be doped with n+ and p+, respectively.

The positions of the contacts CT1 to CT4 and the numbers thereof in FIG. 13 may vary depending on the contact VIAs 150 of FIG. 10.

The NMOS transistor NT and the PMOS transistor PT according to some example embodiments of the present inventive concepts may be implemented with a planar field effect transistor (planar FET), a fin FET, a gate all around FET (GAAFET), or a multi-bridge channel FET (MBCFET), but example embodiments are not limited thereto.

Figure 14:
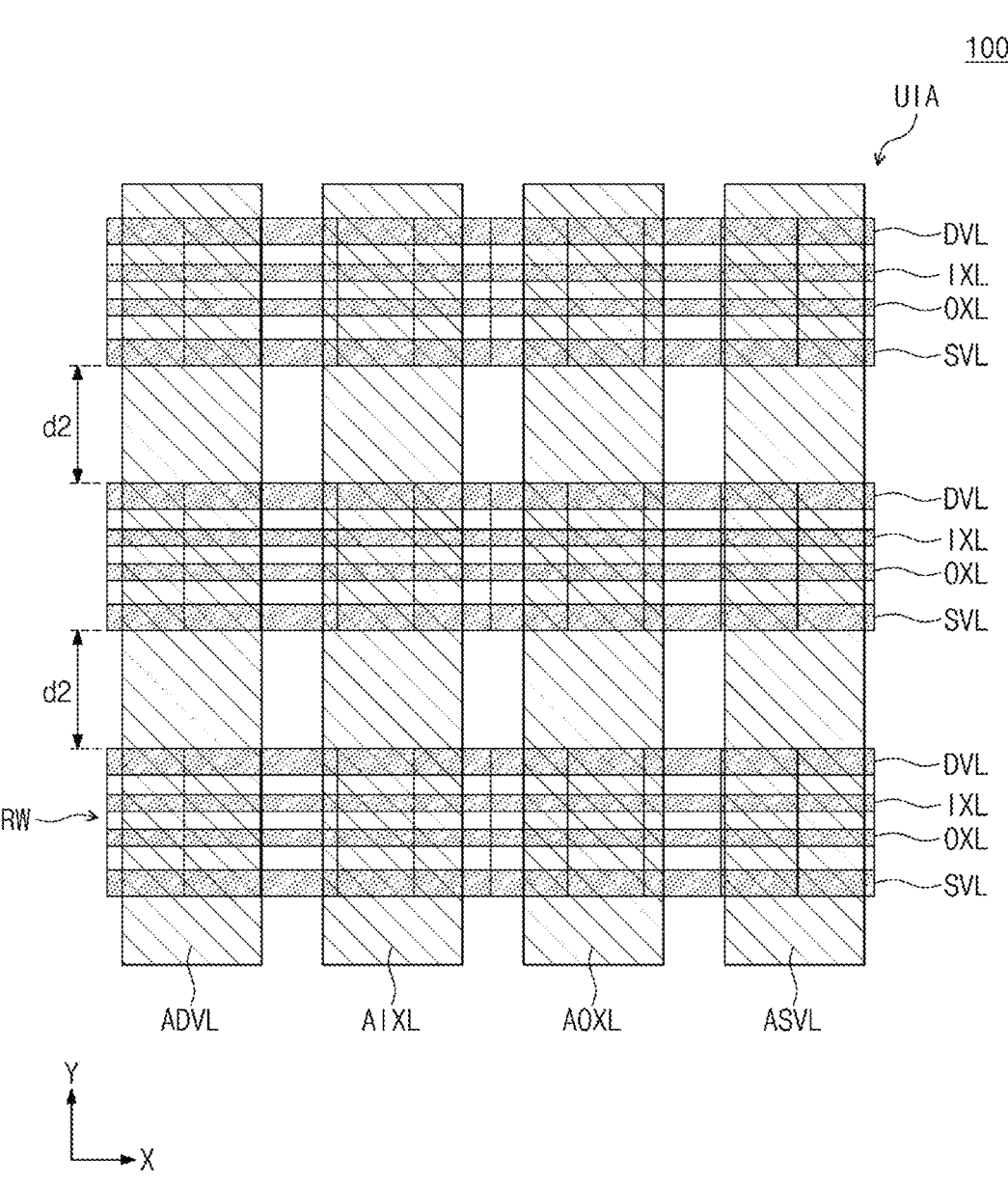
FIGS. 14 and 15 are a perspective view and a plan view of a unit inverter array including unit inverters according to an example embodiment of the present inventive concepts.
Figure 15:
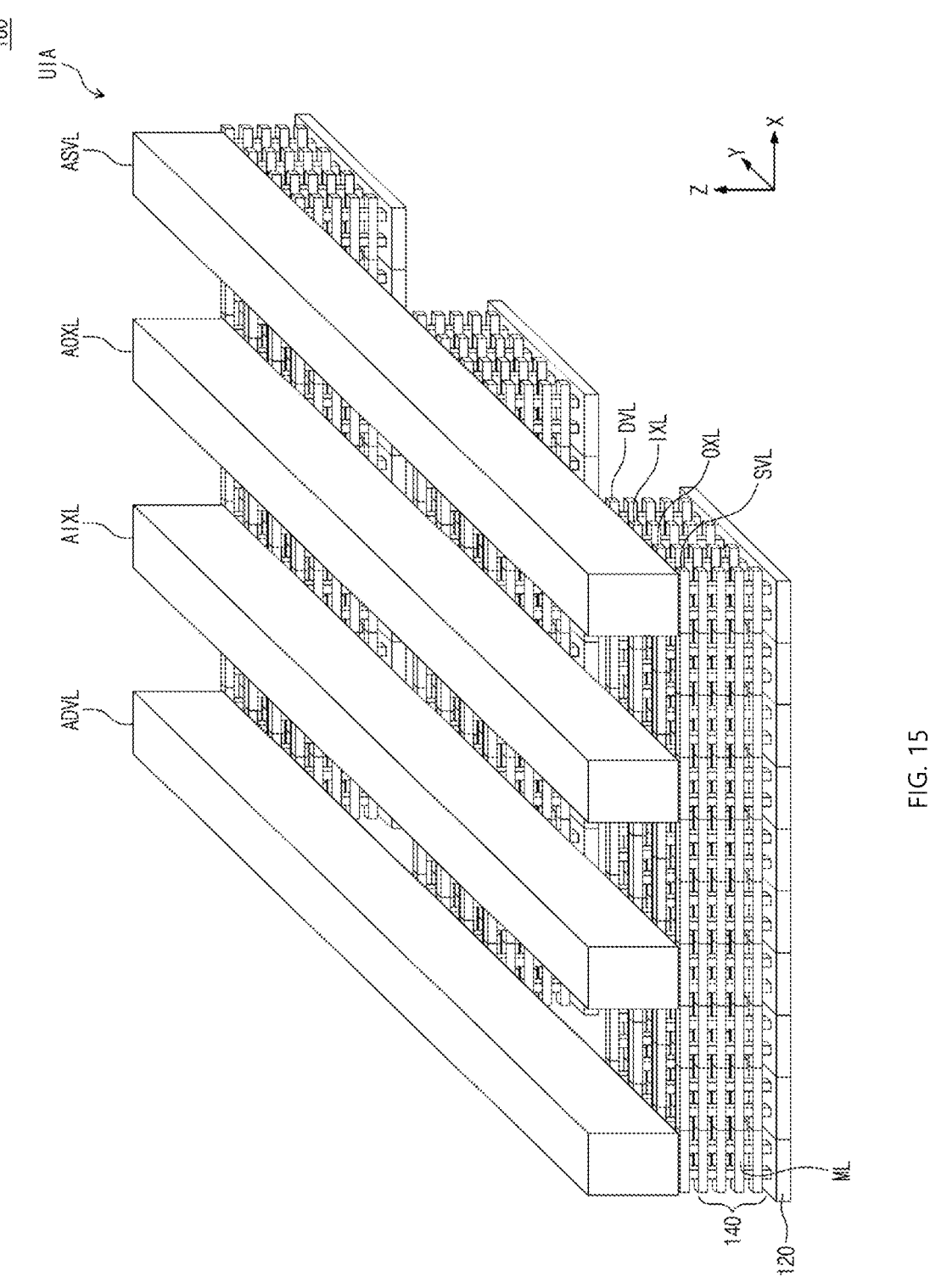

FIGS. 14 and 15 are a perspective view and a plan view of a unit inverter array including unit inverters according to an example embodiment of the present inventive concepts.

Referring to FIGS. 14 and 15, the integrated circuit device 100 according to an example embodiment of the present inventive concepts may include the unit inverter array UIA in which the unit inverters UI are arranged in an array form. For example, the unit inverter array UIA according to an example embodiment of the present inventive concepts may include three rows RW, each of which is formed of 10 unit inverters UI continuously located in the x-axis direction. In each of the rows RW, the unit inverters UI located adjacent to each other in the x-axis direction may be electrically isolated by a device isolation film (not illustrated). Accordingly, the influence of a voltage drop by merged areas of the unit inverters UI located adjacent to each other in the x-axis direction may be reduced or eliminated.

When the driving strength of one unit inverter UI is "1×", the driving strength of the unit inverter array UIA including the 30 unit inverters UI may be "30×".

The input signal line IXL, the output signal line OXL, the power voltage line DVL, the ground voltage line SVL, and the metal lines ML may be commonly provided for the unit inverters UI constituting the rows RW of the unit inverter array UIA. Because routing is performed only in the z-axis direction within one unit inverter UI as described above, routing between the unit inverters UI located adjacent to each other in the x-axis direction may be performed only by the input signal line IXL, the output signal line OXL, the power voltage line DVL, and the ground voltage line SVL. That is, the metal lines ML of the metal line stack 140 may not be involved in the routing between the unit inverters UI located adjacent to each other in the x-axis direction.

As described above, in routing a signal or voltage between the unit inverters UI, the integrated circuit device 100 according to some example embodiments of the present inventive concepts may perform the routing by the input signal line IXL, the output signal line OXL, the power voltage line DVL, and the ground voltage line SVL that have a relatively low resistance value, thereby minimizing the influence of resistance by the routing and stably performing a high-speed operation.

Referring to FIGS. 14 and 15, the three rows RW of the unit inverter array UIA may be spaced apart from each other by the second separation distance d2. In each of the three rows RW of the unit inverter array UIA, the sequence of the input signal line IXL, the output signal line OXL, the power voltage line DVL, and the ground voltage line SVL in the y-axis direction may be the same. For example, in all of the three rows RW, the ground voltage line SVL, the output signal line OXL, the input signal line IXL, and the power voltage line DVL may be disposed in sequence in the y-axis direction. Accordingly, in the unit inverter array UIA according to an example embodiment of the present inventive concepts, the input signal line IXL, the output signal line OXL, the power voltage line DVL, or the ground voltage line SVL may not be merged or shared between the rows RW located adjacent to each other, and thus the influence of a voltage drop by routing may be reduced or minimized.

The unit inverter array UIA may further include an array input line AIXL connecting the input signal lines IXL of the rows RW, an array output line AOXL connecting the output signal lines OXL of the rows RW, an array power line ADVL connecting the power voltage lines DVL of the rows RW, and an array ground line ASVL connecting the ground voltage lines SVL of the rows RW.

The array input line AIXL may receive an input signal from the outside and may apply the input signal to each of the unit inverters UI through the input signal line IXL. The array output line AOXL may receive an output signal applied from each of the unit inverter UI to the output signal line OXL and may transfer the output signal to the outside. The array power line ADVL and the array ground line ASVL may supply a power voltage and a ground voltage applied from the outside to each of the unit inverters UI through the power voltage line DVL and the ground voltage line SVL. The array input line AIXL, the array output line AOXL, the array power line ADVL, and the array ground line ASVL may be connected with the input signal line IXL, the output signal line OXL, the power voltage line DVL, and the ground voltage line SVL of each row RW of the unit inverter array UIA through a contact VIA (not illustrated).

One, two or more unit inverter arrays UIA according to an example embodiment of the present inventive concepts may be provided to function as a basic unit of an operation of the integrated circuit device 100. The one, two or more unit inverter arrays UIA that function as the basic unit of the operation of the integrated circuit device 100 may be referred to as driving inverters. Two or more unit inverter arrays UIA constituting one driving inverter may be located adjacent to each other in the x-axis direction or the y-axis direction.

Figure 16A:
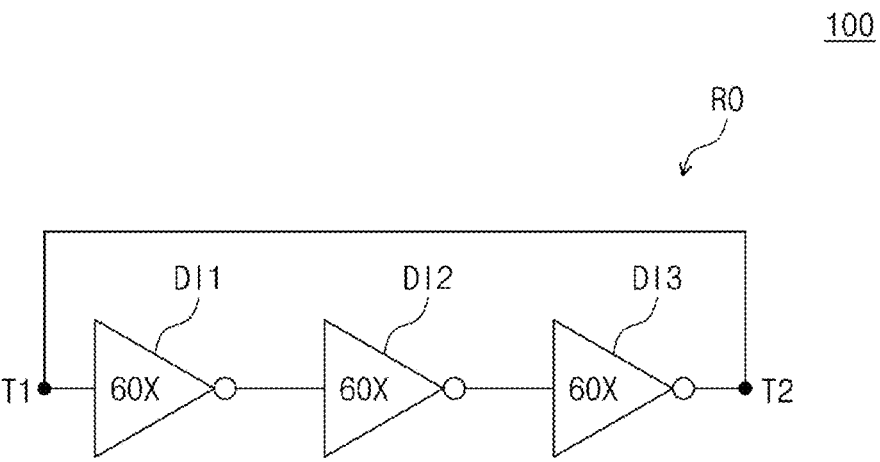
FIGS. 16A and 16B are views illustrating a ring oscillator according to an example embodiment of the present inventive concepts.
Figure 16B:
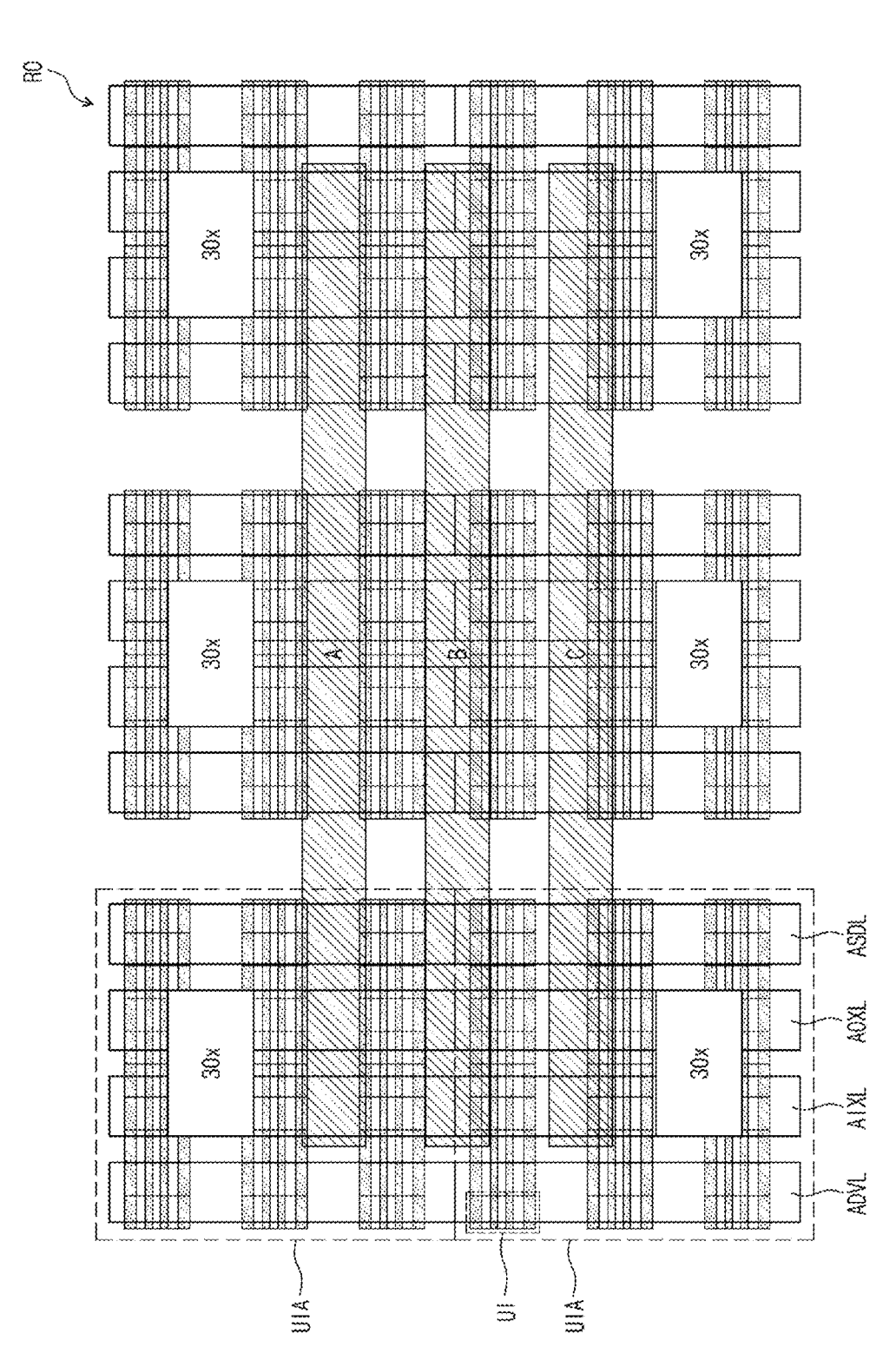

FIGS. 16A and 16B are views illustrating a ring oscillator according to an example embodiment of the present inventive concepts.

Referring to FIGS. 16A and 16B, the integrated circuit device 100 according to an example embodiment of the present inventive concepts may include the ring oscillator RO. FIG. 16A illustrates a logic circuit of the ring oscillator RO according to an example embodiment of the present inventive concepts, and FIG. 16B illustrates a layout of the ring oscillator RO according to an example embodiment of the present inventive concepts.

The ring oscillator RO according to an example embodiment of the present inventive concepts may include a first driving inverter DI1, a second driving inverter DI2, and a third driving inverter DI3 that are connected between a first end T1 and a second end T2.

Each of the first driving inverter DI1, the second driving inverter DI2, and the third driving inverter DI3 may include 60 unit inverters UI, each of which has a driving strength of "1×". However, without being limited thereto, the ring oscillator RO according to some example embodiments of the present inventive concepts may include an odd number of driving inverters greater than or equal to five, and each of the driving inverters may include various numbers of unit inverters, such as 30 unit inverters or 120 unit inverters.

The unit inverters UI included in the first driving inverter DI1, the second driving inverter DI2, and the third driving inverter DI3 may be the same or substantially the same as the unit inverter UI of FIG. 10. The unit inverter arrays UIA included in the first driving inverter DI1, the second driving inverter DI2, and the third driving inverter DI3 may be the same or substantially the same as the unit inverter array UIA of FIG. 14. Each of the first driving inverter DI1, the second driving inverter DI2, and the third driving inverter DI3 may include two unit inverter arrays UIA adjacent to each other in the y-axis direction. Accordingly, the first driving inverter DI1, the second driving inverter DI2, and the third driving inverter DI3 may have a driving strength of "60×".

The ring oscillator RO may perform an oscillation operation by applying an output A of the first driving inverter DI1 as an input of the second driving inverter DI2, applying an output B of the second driving inverter DI2 as an input of the third driving inverter DI3, and feeding back an output C of the third driving inverter DI3 to the first driving inverter DI1.

The output A of the first driving inverter DI1, the output B of the second driving inverter DI2, and the output C of the third driving inverter DI3 may be output from the array output lines AOXL of the unit inverter arrays UIA included in the driving inverters DI1, DI2, and DI3. Likewise, the input C of the first driving inverter DI1, the input A of the second driving inverter DI2, and the input B of the third driving inverter DI3 may be input to the array input lines AIXL of the unit inverter arrays UIA included in the driving inverters DI1, DI2, and DI3.

The ring oscillator RO according to an example embodiment of the present inventive concepts may further include connecting lines CL for connecting the array output lines AOXL and the array input lines AIXL of the driving inverters DI1, DI2, and DI3 located adjacent to each other in the x-axis direction. For example, the ring oscillator RO according to an example embodiment of the present inventive concepts may include a connecting line CL connecting the array output line AOXL of the first driving inverter DI1 and the array input line AIXL of the second driving inverter DI2, a connecting line CL connecting the array output line AOXL of the second driving inverter DI2 and the array input line AIXL of the third driving inverter DI3, and a connecting line CL connecting the array output line AOXL of the third driving inverter DI3 and the array input line AIXL of the first driving inverter DI1. The array output lines AOXL or the array input lines AIXL of the driving inverters corresponding to the connecting lines CL may be electrically connected through contact VIAs (not illustrated).

As described above, the ring oscillator RO according to some example embodiments of the present inventive concepts may be implemented with the unit inverters UI and the unit inverter arrays UIA in which the influence of resistance on the routing of a signal or voltage is reduced or minimized, thereby stably performing a high-speed operation. The ring oscillator RO according to some example embodiments of the present inventive concepts may be included in a high-speed phased locked loop (PLL) such as memory or a communication chip.

Figure 17A:
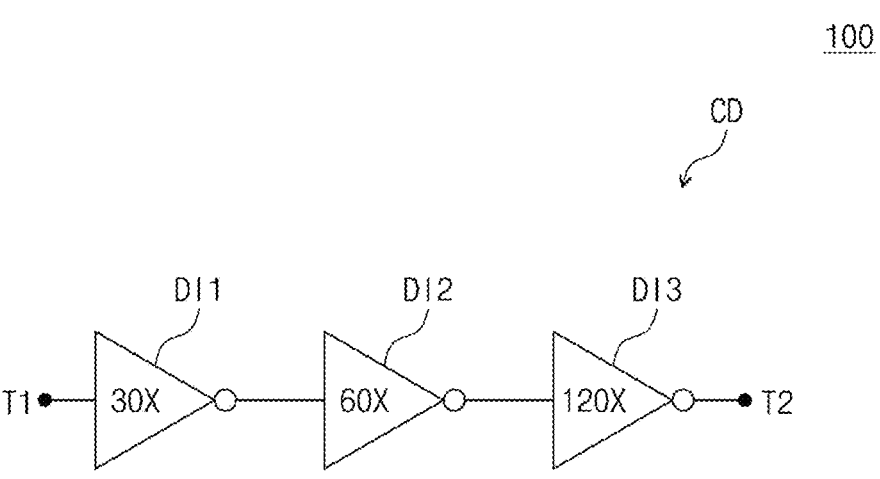
FIGS. 17A, 17B, and 18 are views illustrating a clock driver according to an example embodiment of the present inventive concepts.
Figure 17B:
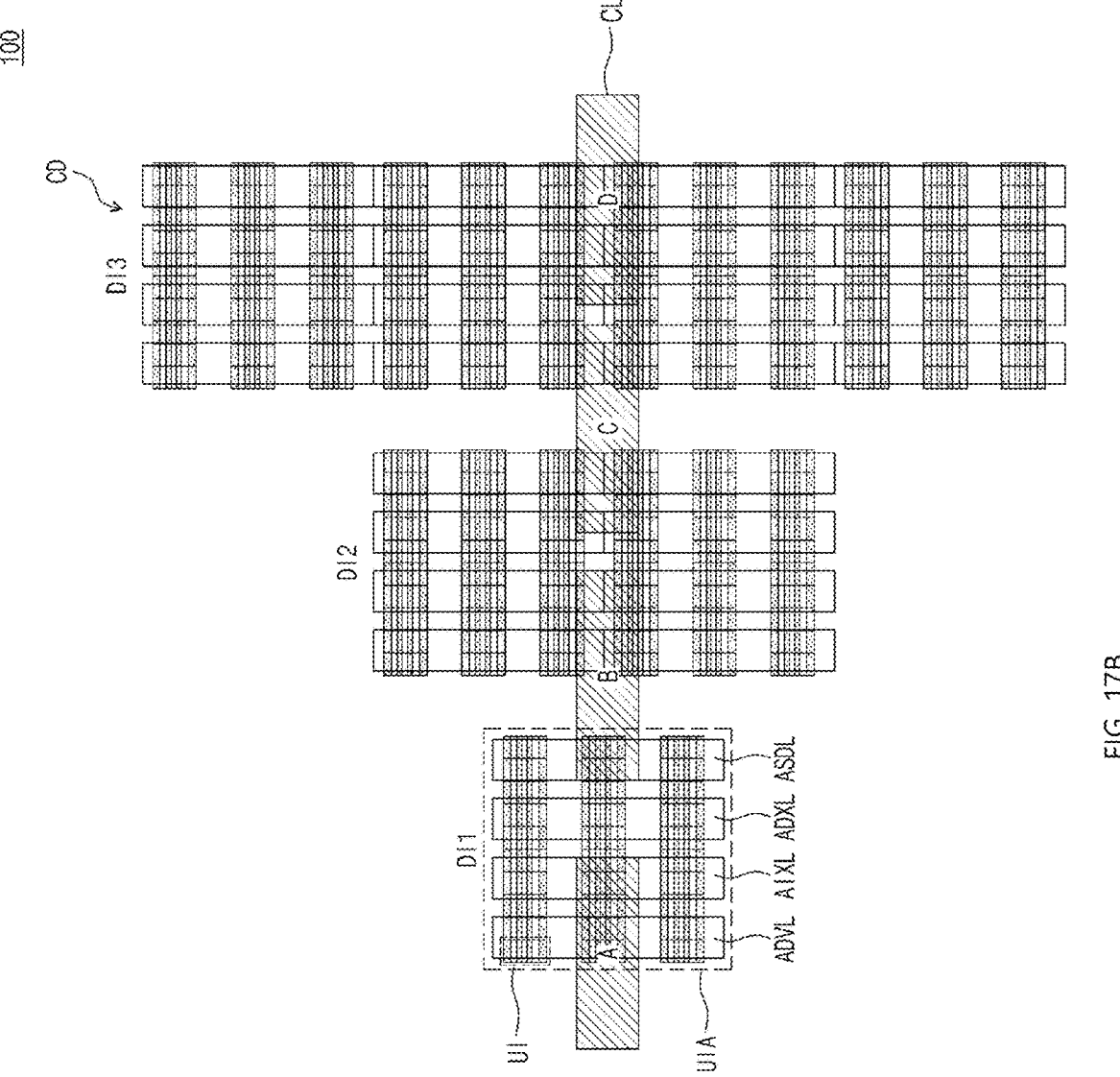
Figure 18:
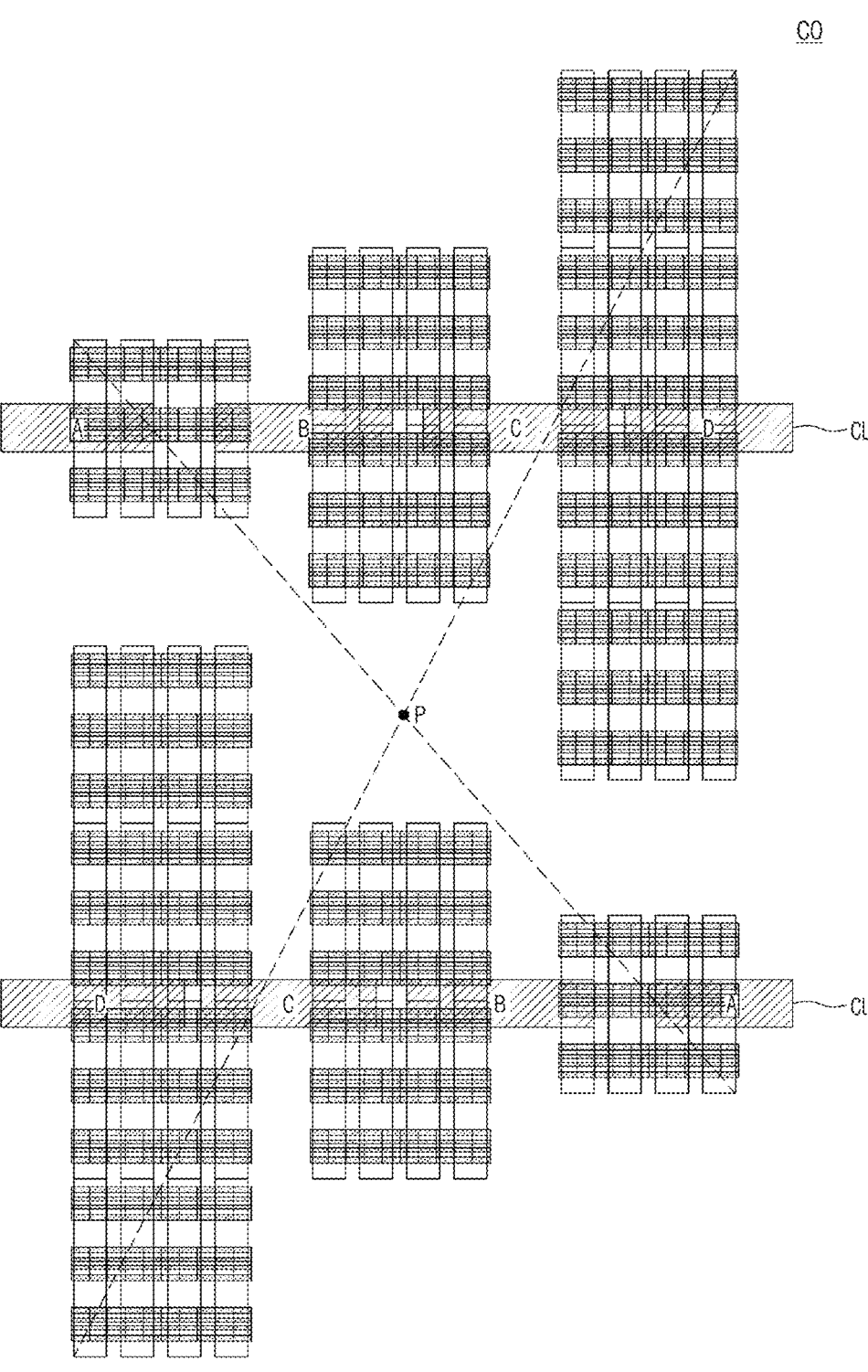

FIGS. 17A, 17B, and 18 are views illustrating a clock driver according to an example embodiment of the present inventive concepts.

Referring to FIGS. 17A and 17B, the integrated circuit device 100 according to an example embodiment of the present inventive concepts may include the clock driver CD. FIG. 17A illustrates a logic circuit of the clock driver CD according to an example embodiment of the present inventive concepts, and FIG. 17B illustrates a layout of the clock driver CD according to an example embodiment of the present inventive concepts.

The clock driver CD according to an example embodiment of the present inventive concepts may include a first driving inverter DI1, a second driving inverter DI2, and a third driving inverter DI3 that are connected between a first end T1 and a second end T2. The first driving inverter DI1 may include 30 unit inverters UI, each of which has a driving strength of "1×". The second driving inverter DI2 may include 60 unit inverters UI, each of which has a driving strength of "1×". The third driving inverter DI3 may include 120 unit inverters UI, each of which has a driving strength of "1×".

The unit inverters UI included in the first driving inverter DI1, the second driving inverter DI2, and the third driving inverter DI3 may be the same or substantially the same as the unit inverter UI of FIG. 10. The unit inverter arrays UIA included in the first driving inverter DI1, the second driving inverter DI2, and the third driving inverter DI3 may be the same or substantially the same as the unit inverter array UIA of FIG. 14.

The first driving inverter DI1, the second driving inverter DI2, and the third driving inverter DI3 may include one unit inverter array UIA, two unit inverter arrays UIA, and four unit inverter arrays UIA, respectively. The two unit inverter arrays UIA of the second driving inverter DI2 and the four unit inverter arrays UIA of the third driving inverter DI3 may be formed adjacent to each other in the y-axis direction. Accordingly, the driving strengths of the first driving inverter DI1, the second driving inverter DI2, and the third driving inverter DI3 may be "30×", "60×", and "120×", respectively. However, without being limited thereto, the clock driver CD according to some example embodiments of the present inventive concepts may include two or less unit inverter arrays UIA or four or more unit inverter arrays UIA, and each of the unit inverter arrays UIA may include a different number of unit inverters UI from each unit inverter array UIA of FIGS. 17A and 17B.

In the clock driver CD according to an example embodiment of the present inventive concepts, a signal O of the first end T1 may be applied as an input of the first driving inverter DI1, an output A of the first driving inverter DI1 may be applied as an input of the second driving inverter DI2, an output B of the second driving inverter DI2 may be applied as an input of the third driving inverter DI3, and an output C of the third driving inverter DI3 may be transferred to the second end T2.

The input O of the first driving inverter DI1, the input A of the second driving inverter DI2, and the input B of the third driving inverter DI3 may be input to array input lines AIXL of the unit inverter arrays UIA included in the driving inverters DI1, DI2, and DI3. Likewise, the output A of the first driving inverter DI1, the output B of the second driving inverter DI2, and the output C of the third driving inverter DI3 may be output from array output lines AOXL of the unit inverter arrays UIA included in the driving inverters DI1, DI2, and DI3.

The clock driver CD according to an example embodiment of the present inventive concepts may further include connecting lines CL for connecting the array output lines AOXL and the array input lines AIXL of the driving inverters DI1, DI2, and DI3 located adjacent to each other in the x-axis direction. For example, the clock driver CD according to an example embodiment of the present inventive concepts may include a connecting line CL connecting the first end T1 and the array input line AIXL of the second driving inverter DI2, a connecting line CL connecting the array output line AOXL of the first driving inverter DI1 and the array input line AIXL of the second driving inverter DI2, a connecting line CL connecting the array output line AOXL of the second driving inverter DI2 and the array input line AIXL of the third driving inverter DI3, and a connecting line CL connecting the array output line AOXL of the third driving inverter DI3 and the second end T2. The array output lines AOXL or the array input lines AIXL of the driving inverters corresponding to the connecting lines CL may be electrically connected through contact VIAs (not illustrated).

Referring to FIG. 18, the integrated circuit device 100 according to an example embodiment of the present inventive concepts may include two clock drivers CD. The two clock drivers CD may be provided adjacent to each other in the y-axis direction. The two clock drivers CD may have point symmetry with respect to any point P between the two clock drivers CD, and thus the area may be reduced or minimized Unlike in FIG. 18, the integrated circuit device 100 according to an example embodiment of the present inventive concepts may include three or more clock drivers CD, and the clock drivers adjacent to each other in the y-axis direction may be arranged as illustrated in FIG. 18.

As described above, the clock driver CD according to some example embodiments of the present inventive concepts may be implemented with the unit inverters UI and the unit inverter arrays UIA in which the influence of resistance on the routing of a signal or voltage is reduced or minimized, thereby stably performing a high-speed operation. The clock driver CD according to some example embodiments of the present inventive concepts may be included in a high-speed PLL such as memory or a communication chip.

Figure 19:
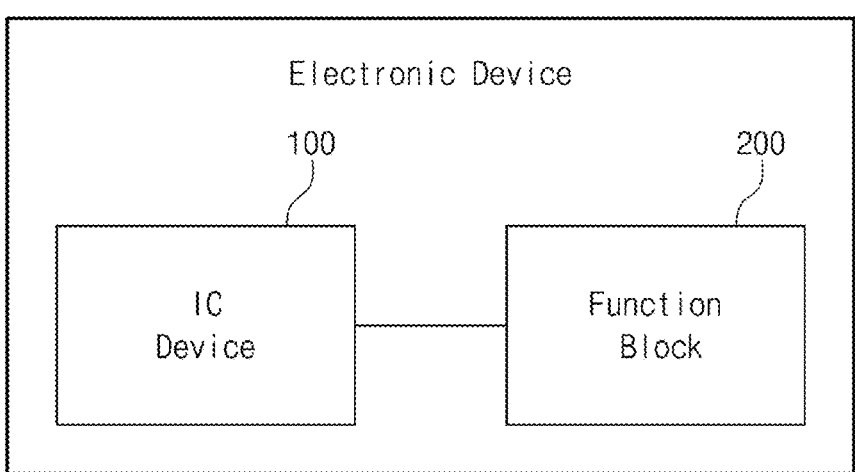
FIG. 19 is a view illustrating an electronic device according to an example embodiment of the present inventive concepts.

FIG. 19 is a view illustrating an electronic device according to an example embodiment of the present inventive concepts.

Referring to FIG. 19, the electronic device 1000 according to an example embodiment of the present inventive concepts may include the integrated circuit device 100 of FIG. 1 and the like described above. The electronic device 1000 according to an example embodiment of the present inventive concepts may be a memory device or a communication device that includes a function block 200 operating in response to a signal, such as clock, which is generated or controlled by the integrated circuit device 100.

The integrated circuit device 100 according to an example embodiment of the present inventive concepts may be the ring oscillator RO of FIGS. 16A and 16B or the clock driver CD of FIGS. 17A and 17B that is included in the electronic device 1000 or a PLL of the electronic device 1000. Alternatively, the integrated circuit device 100 according to an example embodiment of the present inventive concepts may be implemented with a current-controlled oscillator CCO (not illustrated) that is included in the electronic device 1000 or the PLL of the electronic device 1000. Although not illustrated, the CCO according to some example embodiments of the present inventive concepts may be implemented with the unit inverter UI of FIG. 10 and the unit inverter array UIA of FIG. 14 in which the influence of resistance on the routing of a signal or voltage is reduced or minimized.

The influence of resistance on the routing of a signal and a voltage may be reduced or minimized in the integrated circuit device 100 according to some example embodiments of the present inventive concepts, and thus the electronic device 1000 according to some example embodiments of the present inventive concepts may stably perform an operation required for the electronic device 1000 even in a high-speed operation, for example, a high-speed operation of about 30 GHz.

According to the present inventive concepts, by reducing minimizing the influence of resistance or a voltage drop on routing of a signal or voltage in the integrated circuit device and the influence of electromigration (EM) depending on an increase in current density, the integrated circuit device and the electronic device including the integrated circuit device may stably operate even in a high-speed operation.

The above-described contents are example embodiments for carrying out the present inventive concepts. The present inventive concepts include not only the above-described example embodiments but also example embodiments that can be made through a simple design change or can be easily modified. Furthermore, the present inventive concepts include technologies that can be carried out by easily modifying some example embodiments. Accordingly, the scope of the present inventive concepts should not be determined by the above-described example embodiments.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

While the present inventive concepts have been described with reference to some example embodiments thereof, it will be apparent to those of ordinary skill in the art that various changes and modifications may be made thereto without departing from the scope of the present inventive concepts.

What is claimed is:

1. An integrated circuit device comprising:
a substrate; and
a unit cell on the substrate,
wherein the unit cell includes:
a unit cell area including at least two discrete devices;
a routing layer configured to route, in only one direction, a signal and a voltage to the at least two discrete devices, the routing layer including a signal line and a voltage line extending in parallel in a first direction, the signal line and the voltage line being spaced apart from each other in a second direction, the single one direction being a third direction crossing the first direction and the second direction;
a metal line stack including metal lines stacked between the unit cell area and the routing layer in the first direction; and
a plurality of contact vias each configured to connect two adjacent ones of the signal line, the voltage line, the metal lines and the at least two discrete devices, in the third direction.

2. The integrated circuit device of claim 1, wherein the routing layer includes at least two layers.

3. The integrated circuit device of claim 1, wherein
at least one of the signal line and the voltage line includes two or more lines, and
adjacent ones of the signal or voltage lines are evenly spaced apart from each other by a first separation distance.

4. The integrated circuit device of claim 3, wherein there are a same number of contact vias for each of the discrete devices, the signal line, the voltage line, and the metal lines.

5. The integrated circuit device of claim 1, wherein metal lines of the metal line stack corresponding to the signal line are separate from metal lines of the metal line stack corresponding to the voltage line.

6. The integrated circuit device of claim 5, wherein in the unit cell, the routing layer is configured to route the signal and the voltage for the at least two discrete devices in the third direction.

7. The integrated circuit device of claim 1, wherein
m*n unit cells define a unit cell array, and m and n are each integers greater than or equal to one,
the m unit cells define n rows of the unit cell array in the first direction, and
the unit cells adjacent to each other in the first direction are electrically isolated by a device isolation film.

8. The integrated circuit device of claim 7, wherein
the signal line, the voltage line, and the metal lines adjacent to each other in the first direction are connected, and
the routing layer is configured to route the unit cells adjacent to each other in the first direction by the signal line that is connected in the first direction and the voltage line that is connected in the first direction.

9. The integrated circuit device of claim 8, further comprising:
an array signal line configured to connect the signal lines of the n rows; and
an array voltage line configured to connect the voltage lines of the n rows.

10. The integrated circuit device of claim 7, wherein ones of the n rows adjacent to each other in the second direction are spaced apart from each other by a second separation distance.

11. The integrated circuit device of claim 10, wherein the signal line and the voltage line are in a same sequence in the second direction for each of the n rows.

12. The integrated circuit device of claim 7, wherein when a driving strength of the unit cell is 1, a driving strength of the unit cell array is m*n.

13. The integrated circuit device of claim 1, wherein
the signal line includes an input signal line and an output signal line configured to route an input signal and an output signal for the at least two discrete devices, the voltage line includes a power voltage line and a ground voltage line configured to apply a power voltage and a ground voltage to the at least two discrete devices, and the at least two discrete devices include an NMOS transistor and a PMOS transistor each configured to receive the input signal at a gate, output the output signal from a source-drain region, and receive the power voltage or the ground voltage at the source-drain region.

14. An integrated circuit device comprising a unit inverter, wherein the unit inverter includes:

an NMOS transistor and a PMOS transistor in a unit cell area of a substrate;

an input signal line, an output signal line, a power voltage line, and a ground voltage line that (i) extend in parallel in a first direction and (ii) are configured to route an input signal, an output signal, a power voltage, and a ground voltage, in only one direction, to the NMOS transistor and the PMOS transistor, the one direction crossing the first direction; and a metal line stack including metal lines extending in the first direction and stacked one above another, wherein the metal lines include at least one separate metal line corresponding to each of the input signal line, the output signal line, the power voltage line, and the ground voltage line, and wherein the metal lines connect the NMOS transistor and the PMOS transistor with corresponding ones of the input signal line, the output signal line, the power voltage line, and the ground voltage line through contact vias.

15. The integrated circuit device of claim 14, wherein adjacent ones of the input signal line, the output signal line, the power voltage line, and the ground voltage line are spaced apart from each other by a first separation distance in a second direction.

16. The integrated circuit device of claim 14, wherein m*n unit inverters define a unit inverter array, the m unit inverters extend in the first direction to define n rows of the unit inverter array, and the unit inverters adjacent to each other in the first direction are electrically isolated by a device isolation film.

17. The integrated circuit device of claim 16, further comprising:

a ring oscillator including an odd number of driving inverters greater than or equal to three, each driving inverter including one or more the unit inverter arrays, and the driving inverters between a first end and a second end, wherein at least one of the driving inverters adjacent to each other in the first direction is configured to supply an output as an input of a driving inverter adjacent to the second end, the driving inverter configured to supply the output adjacent to the first end, and one of the driving inverters closest to the second end is configured to feed back an output to one of the driving inverters closest to the first end.

18. The integrated circuit device of claim 16, further comprising:

a clock driver including at least two driving inverters, each driving inverter including one or more the unit inverter arrays, and the at least two driving inverters between a first end and a second end, wherein at least one of the driving inverters adjacent to each other in the first direction is configured to supply an output as an input of at least one of the driving inverters adjacent to the second end.

19. An electronic device comprising:

the integrated circuit device of claim 1; and a function block configured to operate in response to a clock or signal generated or controlled by the integrated circuit device.

20. An integrated circuit device comprising:

a substrate; and a unit cell on the substrate, wherein the unit cell includes:

a unit cell area including at least two discrete devices;

a routing layer configured to route a signal and a voltage to the at least two discrete devices, the routing layer including a signal line and a voltage line extending in a first direction, the signal line and the voltage line being spaced apart from each other in a second direction;

a metal line stack including metal lines stacked between the unit cell area and the routing layer in the first direction; and a plurality of contact vias each configured to connect two adjacent ones of the signal line, the voltage line, the metal lines and the at least two discrete devices, in a third direction, wherein at least one of the metal lines adjacent to the unit cell area has a higher resistance value than at least one of the metal lines adjacent to the routing layer, and wherein the signal line and the voltage line have a lower resistance value than at least one of the metal lines adjacent to the signal line and the voltage line.

* * * * *